US009741556B2

(12) United States Patent
Yamamoto et al.

(10) Patent No.: US 9,741,556 B2
(45) Date of Patent: Aug. 22, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Ryuji Yamamoto, Tokyo (JP); Yoshiro Hirose, Toyama (JP); Satoshi Shimamoto, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 14/728,728

(22) Filed: Jun. 2, 2015

(65) Prior Publication Data

US 2015/0357181 A1    Dec. 10, 2015

(30) Foreign Application Priority Data

Jun. 4, 2014 (JP) .................................. 2014-115723

(51) Int. Cl.
*H01L 21/44* (2006.01)
*H01L 21/02* (2006.01)
(Continued)

(52) U.S. Cl.
CPC .......... *H01L 21/0228* (2013.01); *C23C 16/30* (2013.01); *C23C 16/36* (2013.01);
(Continued)

(58) Field of Classification Search
CPC ................................................. H01L 21/0214
See application file for complete search history.

(56) References Cited

U.S. PATENT DOCUMENTS 8,268,409 B2 * 9/2012 Elers ....................... C23C 16/32
427/248.1
8,329,599 B2    12/2012 Fukazawa et al.
(Continued)

FOREIGN PATENT DOCUMENTS

JP    2010-209281 A    9/2010
JP    2013102130 A    5/2013
(Continued)

OTHER PUBLICATIONS

Japanese Office Action for JP 2014-115723, dated Nov. 4, 2015, 3 pages (with English translation).
(Continued)

*Primary Examiner* — Zandra Smith
*Assistant Examiner* — Andre' C Stevenson
(74) *Attorney, Agent, or Firm* — Volpe and Koenig, P.C.

(57) ABSTRACT

Technique includes forming a film containing first element, second element and carbon on a substrate by performing a cycle a predetermined number of times. The cycle includes non-simultaneously performing forming a first solid layer having thickness of more than one atomic layer and equal to or less than several atomic layers and containing chemical bonds of the first element and carbon by supplying a precursor having the chemical bonds to the substrate under a condition where the precursor is pyrolyzed and at least some of the chemical bonds contained in the precursor are maintained without being broken, and forming a second solid layer by plasma-exciting a reactant containing the second element and supplying the plasma-excited reactant to the substrate, or by plasma-exciting an inert gas and supplying the plasma-excited inert gas and a reactant containing the second element which is not plasma-excited to the substrate.

18 Claims, 11 Drawing Sheets

(51) Int. Cl.
　　*C23C 16/52* (2006.01)
　　*C23C 16/30* (2006.01)
　　*C23C 16/36* (2006.01)
　　*C23C 16/455* (2006.01)
　　*H01J 37/32* (2006.01)

(52) U.S. Cl.
　　CPC ........ *C23C 16/45536* (2013.01); *C23C 16/52* (2013.01); *H01J 37/3244* (2013.01); *H01J 37/32091* (2013.01); *H01J 37/32532* (2013.01); *H01L 21/0214* (2013.01); *H01L 21/02126* (2013.01); *H01L 21/02211* (2013.01)

(56) References Cited

U.S. PATENT DOCUMENTS

| | | |
|---|---|---|
| 8,563,443 B2 | 10/2013 | Fukazawa |
| 8,846,546 B2 | 9/2014 | Takeda |
| 9,018,104 B2 | 4/2015 | Hirose et al. |
| 2006/0028903 A1 | 2/2006 | Hada |
| 2008/0241381 A1* | 10/2008 | Suzuki ................ C23C 16/0209 427/255.28 |
| 2010/0181566 A1* | 7/2010 | Lee .................... H01L 21/02554 257/43 |
| 2013/0252437 A1 | 9/2013 | Sano |
| 2014/0315086 A1* | 10/2014 | Put ...................... H01M 4/0416 429/220 |

FOREIGN PATENT DOCUMENTS

| | | |
|---|---|---|
| KR | 20120092672 A1 | 8/2012 |
| KR | 20130044140 A1 | 5/2013 |
| KR | 20130107249 A1 | 10/2013 |
| WO | 2011125395 A1 | 10/2011 |

OTHER PUBLICATIONS

Korean Office Action with English concise explanation, Korean Patent Application No. 10-2015-0078932, dated Mar. 2, 2016.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-115723, filed on Jun. 4, 2014, the entire contents of which are incorporated herein by reference.

TECHNICAL FIELD

The present disclosure relates to a method of manufacturing a semiconductor device, a substrate processing apparatus, and a recording medium.

BACKGROUND

As an example of procedures of manufacturing a semiconductor device, a procedure of forming a film such as a nitride film, an oxide film or the like on a substrate is often carried out by supplying, e.g., a precursor containing silicon and a reactant such as a nitriding gas, an oxidizing gas or the like to the substrate.

If carbon (C) or the like is added to the film formed on the substrate, it is possible to increase, e.g., a resistance to hydrogen fluoride (HF). If carbon is added to the film at a high concentration by accurately controlling a carbon concentration in the film, it is possible to further increase the HF resistance of the film.

SUMMARY

The present disclosure provides some embodiments of a technique capable of forming a film having a high carbon concentration.

According to one embodiment of the present disclosure, there is provided a technique including forming a film containing a first element, a second element and carbon on a substrate by performing a cycle a predetermined number of times, wherein the cycle includes non-simultaneously performing forming a first solid layer having a thickness of more than one atomic layer and equal to or less than several atomic layers and containing chemical bonds of the first element and carbon by supplying a precursor having the chemical bonds of the first element and carbon to the substrate under a condition in which the precursor is pyrolyzed and at least some of the chemical bonds of the first element and carbon contained in the precursor are maintained without being broken; and forming a second solid layer by plasma-exciting a reactant containing the second element and supplying the plasma-excited reactant to the substrate to modify the first solid layer, or by plasma-exciting an inert gas and supplying the plasma-excited inert gas and a reactant containing the second element which is not plasma-excited to the substrate to modify the first solid layer.

DETAILED DESCRIPTION

One Embodiment of the Present Disclosure

One embodiment of the present disclosure is described with reference to FIGS. 1 to 3.

(1) Configuration of Substrate Processing Apparatus

Figure 1:
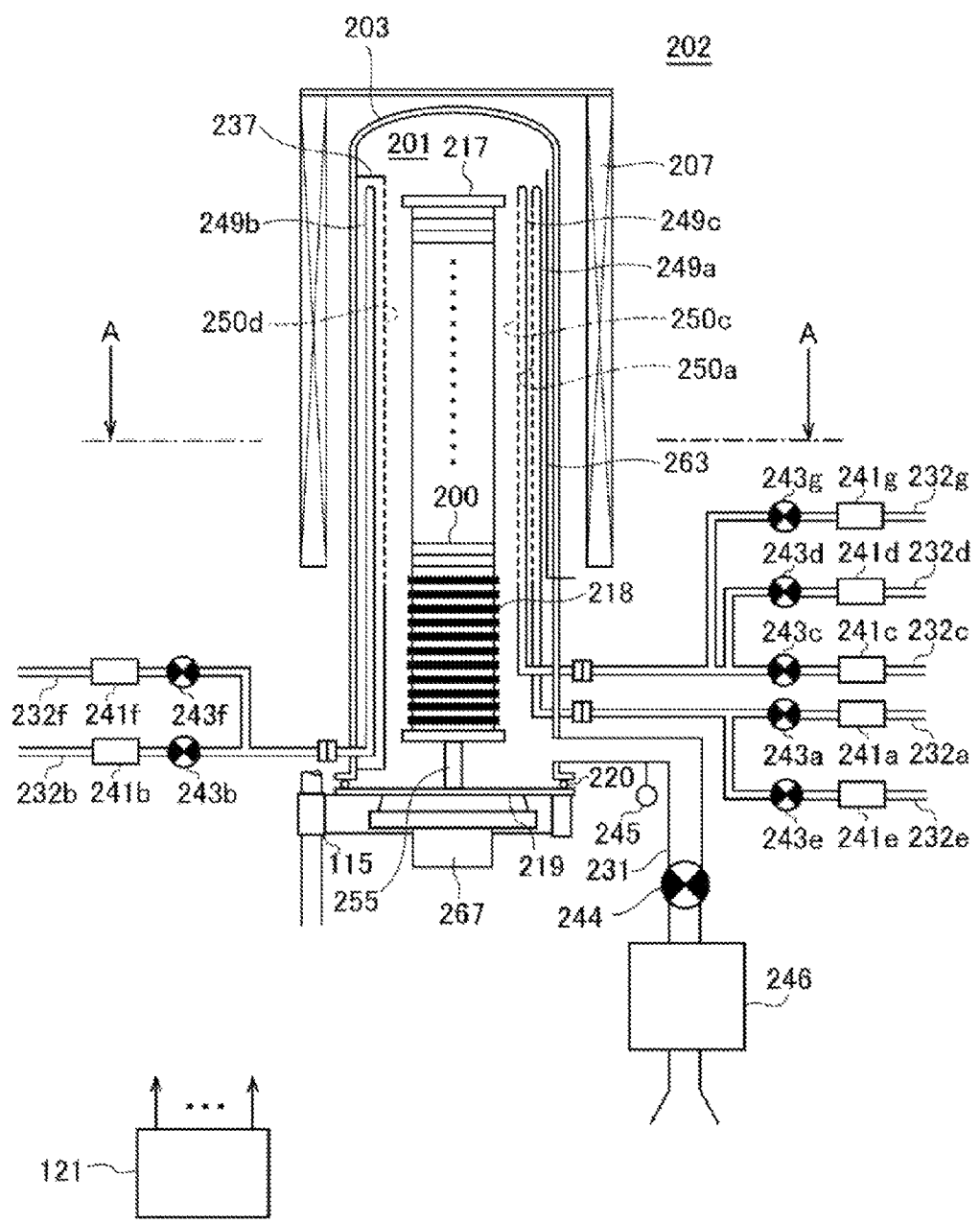
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating unit (a heating mechanism). The heater 207 has a cylindrical shape and is supported by a heater base (not shown) serving as a support plate so as to be vertically installed. As will be described later, the heater 207 functions as an excitation unit (an activation mechanism) configured to thermally excite (activate) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

Nozzles 249a to 249c serving as gas supply parts are installed in the process chamber 201 to penetrate through a lower portion of the reaction tube 203. The nozzles 249a to 249c are made of, e.g., a heat resistant material such as quartz, SiC or the like. Gas supply pipes 232a to 232c are respectively connected to the nozzles 249a to 249c. A gas supply pipe 232d is connected to the gas supply pipe 232c. In this way, the three nozzles 249a to 249c and the four gas supply pipes 232a to 232d are installed in the reaction tube 203 and are configured to supply plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a to 241d, which are flow rate controllers (flow rate control units), and valves 243a to 243d, which are opening/closing valves, are sequentially installed in the gas supply pipes 232a to 232d from corresponding upstream sides. Gas supply pipes 232e to 232g, which supply an inert gas, are respectively connected to the gas supply pipes 232a to 232c at the downstream side of the valves 243a to 243c. MFCs 241e to 241g, which are flow rate controllers (flow rate control units), and valves 243e to 243g, which are opening/closing valves, are sequentially installed in the gas supply pipes 232e to 232g from the corresponding upstream sides.

The nozzles 249a and 249c are respectively connected to end portions of the gas supply pipes 232a and 232c. As shown in FIG. 2, the nozzles 249a and 249c are disposed in an annular space between the inner wall of the reaction tube 203 and the wafers 200 such that the nozzles 249a and 249c extend upward along a stacking direction of the wafers 200 from a lower portion of the inner wall of the reaction tube 203 to an upper portion thereof. Specifically, the nozzles 249a and 249c are installed along a wafer arrangement region in which the wafers 200 are arranged and in a region that horizontally surrounds the wafer arrangement region at a side of the wafer arrangement region. That is to say, the nozzles 249a and 249c are installed perpendicularly to the surfaces (the flat surfaces) of the wafers 200 at a lateral side of the end portions (the peripheral edge portions) of the wafers 200 carried into the process chamber 201. Each of the nozzles 249a and 249c is configured as an L-shaped long nozzle. A horizontal portion of each of the nozzles 249a and 249c is installed to penetrate a lower sidewall of the reaction tube 203. A vertical portion of each of the nozzles 249a and 249c is installed to extend upward at least from one end portion of the wafer arrangement region toward the other end portion thereof. Gas supply holes 250a and 250c for supplying a gas are respectively formed on the side surfaces of the nozzles 249a and 249c. Each of the gas supply holes 250a and 250c is opened toward the center of the reaction tube 203 to allow the gas to be supplied toward the wafers 200. The gas supply holes 250a and 250c may be formed in a plural number so as to span from the lower portion of the reaction tube 203 to the upper portion thereof. The respective gas supply holes 250a and 250c may have the same opening area. Further, the gas supply holes 250a and 250c may be formed at a predetermined opening pitch.

The nozzle 249b is connected to an end portion of the gas supply pipe 232b. The nozzle 249b is installed within a buffer chamber 237 as a gas supply part. The buffer chamber 237 serves also as a gas distribution space. The buffer chamber 237 is installed in an annular space defined between the inner wall of the reaction tube 203 and the wafers 200 and in a region spanning from the lower portion of the inner wall of the reaction tube 203 to the upper portion thereof, so as to extend along the stacking direction of the wafers 200. That is to say, the buffer chamber 237 is installed in a lateral side of a wafer arrangement region horizontally surrounding the wafer arrangement region, so as to extend along the wafer arrangement region. In other words, the buffer chamber 237 is installed at the lateral side of the end portions of the wafers 200 carried into the process chamber 201. Gas supply holes 250d configured to supply a gas is formed in the end portion of the wall of the buffer chamber 237 adjoining the wafers 200. The gas supply holes 250d are opened toward the center of the reaction tube 203 and are configured to supply a gas toward the wafers 200. The gas supply holes 250d are formed in a plural number so as to span from the lower portion of the reaction tube 203 to the upper portion thereof. The respective gas supply holes 250d have the same opening area and are formed at a regular opening pitch.

The nozzle 249b is installed at the opposite end portion of the buffer chamber 237 from the end portion in which the gas supply holes 250d are formed, so as to extend upward in the stacking direction of the wafers 200 from the lower portion of the inner wall of the reaction tube 203 to the upper portion thereof. Specifically, the nozzle 249b is installed along the wafer arrangement region in which the wafers 200 are arranged and in a region that horizontally surrounds the wafer arrangement region. In other words, the nozzle 249b is installed perpendicularly to the surfaces of the wafers 200 at a lateral side of end portions of the wafers 200 carried into the process chamber 201. The nozzle 249b is configured as an L-shaped long nozzle. A horizontal portion of the nozzle 249b is installed to penetrate a lower sidewall of the reaction tube 203. A vertical portion of the nozzle 249b is installed to extend upward at least from one end portion of the wafer arrangement region toward the other end portion thereof. Gas supply holes 250b for supplying a gas are formed on the side surface of the nozzle 249b. The gas supply holes 250b are opened toward the center of the buffer chamber 237. Similar to the gas supply holes 250d, the gas supply holes 250b are formed in a plural number so as to span from the lower portion of the reaction tube 203 to the upper portion thereof. If a pressure difference between an interior of the buffer chamber 237 and an interior of the process chamber 201 is small, the gas supply holes 250b may be configured to have the same opening area. Further, the gas supply holes 250b may be formed at a predetermined opening pitch from an upstream side (i.e., a lower portion) to a downstream side (i.e., an upper portion). In contrast, if the pressure difference between the interior of the buffer chamber 237 and the interior of the process chamber 201 is large, the opening area of the gas supply holes 250b may be set to become gradually larger from the upstream side toward the downstream side. Alternatively or additionally, the opening pitch of the gas supply holes 250b may be set to become gradually smaller from the upstream side toward the downstream side.

By adjusting the opening area and the opening pitch of the gas supply holes 250b from the upstream side to the downstream side as described above, a gas may be injected from the respective gas supply holes 250b substantially at the same flow rate but at different flow velocities. The gas injected from the individual gas supply holes 250b is first introduced into the buffer chamber 237. This makes it possible to make uniform the flow velocities of the gas within the buffer chamber 237. The particle velocity of the gas injected from the respective gas supply holes 250b into the buffer chamber 237 are reduced in the buffer chamber 237. Then, the gas is injected from the respective gas supply holes 250d into the process chamber 201. The gas which has flown into the buffer chamber 237 from the respective gas supply holes 250b has a uniform flow rate and a uniform flow velocity when ejected from the respective gas supply holes 250d into the process chamber 201.

As described above, in the present embodiment, a gas is transferred through the nozzles 249a to 249c, which are disposed in the vertically-elongated annular space, i.e., a cylindrical space, defined by the inner wall of the reaction tube 203 and the end portions of the stacked wafers 200, and the buffer chamber 237. The gas is initially injected into the reaction tube 203, near the wafers 200, through the gas supply holes 250a to 250d formed in the nozzles 249a to 249c and the buffer chamber 237. Accordingly, the gas supplied into the reaction tube 203 mainly flows within the reaction tube 203 in a direction parallel to the surfaces of the wafers 200, i.e., in a horizontal direction. With this configuration, the gas can be uniformly supplied to the respective wafers 200. This makes a thickness of a thin film formed on each of the wafers 200 uniform. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A precursor having a chemical bond of a predetermined element and carbon (C), for example, an alkylene halosilane precursor gas containing Si as the predetermined element, an alkylene group, and a halogen group and having a chemical bond of Si and C (an Si—C bond), or an alkyl halosilane precursor gas containing Si, an alkyl group, and a halogen group and having a Si—C bond, is supplied from the gas supply pipe 232a into the process chamber 201 through the MFC 241a, the valve 243a and the nozzle 249a.

In this configuration, the alkylene group is a functional group obtained by removing two hydrogen (H) atoms from chain-shaped saturated hydrocarbon (alkane), which is denoted as a chemical formula $C_nH_{2n+2}$ and is an aggregate of atoms that are denoted as a chemical formula $C_nH_{2n}$. The alkylene group includes a methylene group, an ethylene group, a propylene group, a butylene group, and so forth. The alkyl group is a functional group obtained by removing one H atom from chain-shaped saturated hydrocarbon, which is denoted as a chemical formula $C_nH_{2n+2}$ and is an aggregate of atoms that are denoted as a chemical formula $C_nH_{2n+1}$. The alkyl group includes a methyl group, an ethyl group, a propyl group, a butyl group, or the like. The halogen group includes a chloro group, a fluoro group, a bromo group, an iodine group, or the like. As such, the halogen group includes a halogen element such as chlorine (Cl), fluorine (F), bromine (Br), iodine (I) or the like.

As the alkylene halosilane precursor gas, it may be possible to use, e.g., a precursor gas containing Si, a methylene group (—$CH_2$—) as an alkylene group and a chloro group (Cl) as a halogen group, namely a chlorosilane precursor gas containing a methylene group, or a precursor gas containing Si, an ethylene group (—$C_2H_4$—) as an alkylene group and a chloro group (Cl) as a halogen group, namely a chlorosilane precursor gas containing an ethylene group. As the chlorosilane precursor gas containing a methylene group, it may be possible to use, e.g., a methylene bis(trichlorosilane) gas, namely a bis(trichlorosilyl)methane (($SiCl_3)_2CH_2$, abbreviation: BTCSM) gas. As the chlorosilane precursor gas containing an ethylene group, it may be possible to use, e.g., an ethylene bis(trichlorosilane) gas, namely a 1,2-bis(trichlorosilyl)ethane (($SiCl_3)_2C_2H_4$, abbreviation: BTCSE) gas.

Figure 11A:
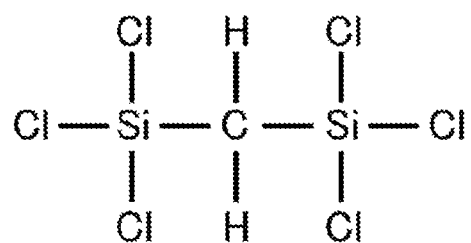
FIG. 11A is a view illustrating a chemical structural formula of BTCSM.

As shown in FIG. 11A, BTCSM contains one methylene group as an alkylene group in its chemical structural formula (in one molecule). Each of two bonds of the methylene group is bonded to Si, such that a Si—C—Si bond is formed.

Figure 11B:
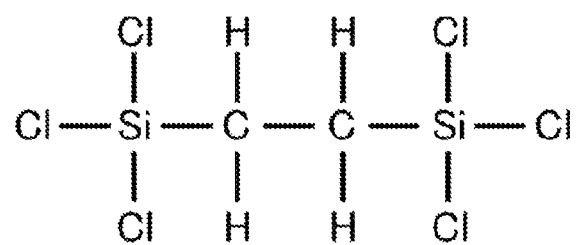
FIG. 11B is a view illustrating a chemical structural formula of BTCSE.

As shown in FIG. 11B, BTCSE contains one ethylene group as an alkylene group in one molecule. Each of two dangling bonds of the ethylene group is bonded to Si such that a Si—C—C—Si bond is formed.

As the alkyl halosilane precursor gas, it may be possible to use, e.g., a precursor gas containing Si, a methyl group (—$CH_3$) as an alkyl group and a chloro group (Cl) as a halogen group, namely a chlorosilane precursor gas containing a methyl group. As the chlorosilane precursor gas containing a methyl group, it may be possible to use, e.g., a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane (($CH_3)_5Si_2Cl$, abbreviation: MCPMDS) gas, or the like. Unlike the alkylene halosilane precursor gas such as the BTCSE gas or the BTCSM gas, the alkyl halosilane precursor gas such as the TCDMDS gas, the DCTMDS gas or the MCPMDS gas is a gas having a Si—Si bond, namely a precursor gas containing a predetermined element and a halogen element and having a chemical bond of the predetermined element.

Figure 11C:
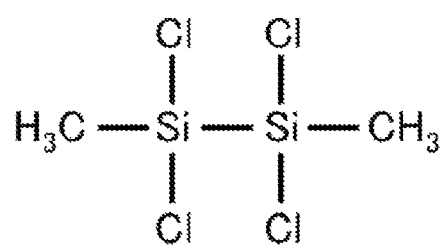
FIG. 11C is a view illustrating a chemical structural formula of TCDMDS.

As shown in FIG. 11C, TCDMDS contains two methyl groups as alkyl groups in one molecule. Each of dangling bonds of the two methyl groups is bonded to Si such that Si—C bonds are formed. TCDMDS is a derivative of disilane, and has a Si—Si bond. As such, TCDMDS has a Si—Si—C bond in which Si and Si are bonded to each other, and Si is bonded to C.

Figure 11D:
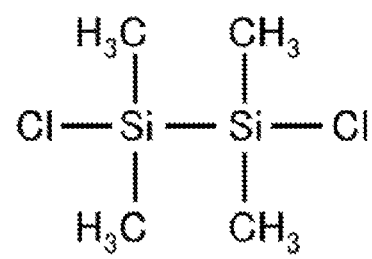
FIG. 11D is a view illustrating a chemical structural formula of DCTMDS.

As shown in FIG. 11D, DCTMDS contains four methyl groups as alkyl groups in one molecule. Each of dangling bonds of the four methyl groups is bonded to Si, such that Si—C bonds are formed. DCTMDS is a derivative of disilane, and has a Si—Si bond. As such, DCTMDS has a Si—Si—C bond in which Si and Si are bonded to each other, and Si is bonded to C.

Figure 11E:
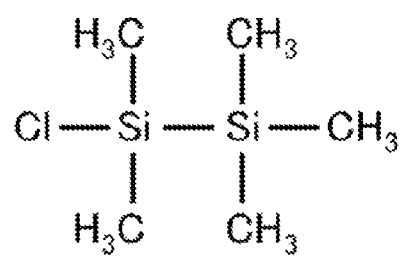
FIG. 11E is a view illustrating a chemical structural formula of MCPMDS.

As shown in FIG. 11E, MCPMDS contains five methyl groups as alkyl groups in one molecule. Each of dangling bonds of the five methyl groups is bonded to Si, such that Si—C bonds are formed. MCPMDS is a derivative of disilane, and has a Si—Si bond. As such, MCPMDS has a Si—Si—C bond in which Si and Si are bonded to each other, and Si is bonded to C. Unlike BTCSM, BTCSE, TCDMDS, and DCTMDS, MCPMDS has an asymmetry structure in which the methyl groups and the chloro groups surrounding Si are asymmetrically arranged in one molecule (in the chemical structural formula). As described above, in the present embodiment, it may be possible to use a precursor having an asymmetric chemical structural formula in addition to a precursor having a symmetric chemical structural formula as shown in FIGS. 11A to 11D.

The alkylene halosilane precursor gas such as the BTCSM gas or the BTCSE gas, and the alkyl halosilane precursor gas such as the TCDMDS gas, the DCTMDS gas, or the MCPMDS gas may be a precursor gas which contains at least two Si atoms in one molecule, contains C and Cl, and has Si—C bonds. In a substrate processing process, which will be described later, this gas acts as a Si source and a C source. The BTCSM gas or the BTCSE gas may be referred to as an alkylene chlorosilane precursor gas. The TCDMDS gas, the DCTMDS gas, and the MCPMDS gas may be referred to as an alkyl chlorosilane precursor gas.

In the subject specification, the precursor gas refers to a precursor in a gaseous state, for example, a gas obtained by vaporizing a precursor which is in a liquid state under room temperature and atmospheric pressure, or a precursor which stays in a gaseous state under room temperature and atmospheric pressure. When the term "precursor" is used herein, it may refer to "a liquid precursor staying in a liquid state," "a precursor gas staying in a gaseous state," or both. In case of using a liquid precursor staying in a liquid state under room temperature and atmospheric pressure, such as BTCSM or the like, the liquid precursor is vaporized by a vaporization system, such as a vaporizer or a bubbler, and is supplied as a precursor gas (a BTCSM gas or the like).

A reactant which differs in chemical structure (molecular structure) from the precursor, e.g., a nitrogen (N)-containing gas which is a reaction gas, may be supplied from the gas supply pipes 232b and 232c into the process chamber 201 through the MFCs 241b and 241c, the valves 243b and 243c, the nozzles 249b and 249c, and the buffer chamber 237. As the nitrogen-containing gas, it may be possible to use, e.g., a hydrogen nitride-based gas. The hydrogen nitride-based gas may be referred to as a substance consisting of only two elements N and H. In a substrate processing process, which will be described later, the nitrogen-containing gas acts as a nitriding gas, namely an N source. As the hydrogen nitride-based gas, it may be possible to use, e.g., an ammonia ($NH_3$) gas.

Alternatively, a reactant which differs in chemical structure from the precursor, e.g., an oxygen (O)-containing gas which is a reaction gas, may be supplied from the gas supply pipes 232b and 232c into the process chamber 201 through the MFCs 241b and 241c, the valves 243b and 243c, the nozzles 249b and 249c, and the buffer chamber 237. In a substrate processing process, which will be described later, the oxygen-containing gas acts as an oxidizing gas, namely an O source. As the oxygen-containing gas, it may be possible to use, e.g., an oxygen ($O_2$) gas.

Further alternatively, a reactant which differs in chemical structure from the precursor, e.g., an N- and C-containing gas which is a reaction gas, may be supplied from the gas supply pipes 232b and 232c into the process chamber 201 through the MFCs 241b and 241c, the valves 243b and 243c, the nozzles 249b and 249c, and the buffer chamber 237. As the N- and C-containing gas, it may be possible to use, e.g., an amine-based gas.

The amine-based gas is a gaseous amine gas, e.g., a gas which is obtained by vaporizing amine which is in a liquid state under room temperature and atmospheric pressure or a gas which contains an amine group such as amine or the like staying in a gaseous state under room temperature and atmospheric pressure. The amine-based gas contains amine such as ethylamine, methylamine, propylamine, isopropylamine, butylamine, isobutylamine, or the like. As used herein, the term "amine" is a generic name of compounds in which a hydrogen atom of ammonia ($NH_3$) is substituted with a hydrocarbon group such as an alkyl group or the like. Amine contains a hydrocarbon group such as an alkyl group or the like as a ligand containing C atoms, namely an organic ligand. The amine-based gas may be referred to as a Si-free gas since it contains three elements C, N, and H while not containing Si. The amine-based gas may be referred to as a Si-free and metal-free gas since it does not contain Si and metal. The amine-based gas may be a substance consisting of only three elements C, N and H. The amine-based gas acts as an N source and as a C source in a substrate processing procedure, which will be described later. The term "amine" as used herein refers to "amine in a liquid state," an "amine-based gas in a gaseous state," or both.

As the amine-based gas, it may be possible to use, e.g., a triethylamine ($(C_2H_5)_3N$, abbreviation: TEA) gas, in which the number of C-containing ligands (ethyl groups) in the chemical structural formula (in one molecule) is two or more and the number of C atoms in one molecule is larger than the number of N atoms. In the case of using amine such as TEA or the like which is in a liquid state under room temperature and atmospheric pressure, the amine in a liquid state is vaporized by a vaporization system such as a vaporizer or a bubbler, and is supplied as an N- and C-containing gas (a TEA gas).

A reactant which differs in chemical structure from the precursor, e.g., a borazine-ring-skeleton-free boron-containing gas which is a reaction gas, may be supplied from the gas supply pipes 232b and 232c into the process chamber 201 through the MFCs 241b and 241c, the valves 243b and 243c, the nozzle 249b and 249c, and the buffer chamber 237. As the borazine-ring-skeleton-free boron-containing gas, it may be possible to use, e.g., a borane-based gas.

The borane-based gas refers to a borane compound in a gaseous state, e.g., a gas obtained by vaporizing a borane compound which stays in a liquid state under room temperature and atmospheric pressure, a borane compound which stays in a gaseous state under room temperature and atmospheric pressure, or the like. The borane compound includes a haloborane compound containing B and a halogen element, e.g., a chloroborane compound containing B and Cl. Further, the borane compound includes borane (borohydride) such as monoborane ($BH_3$), diborane ($B_2H_6$) or the like, or a borane compound (a borane derivative) in which H of borane is substituted with another element or the like. The borane-based gas acts as a B source in a substrate processing procedure, which will be described later. As the borane-based gas, it may be possible to use, e.g., a trichloroborane ($BCl_3$) gas. The $BCl_3$ gas is a boron-containing gas which does not contain a borazine compound, which will be described later, namely a non-borazine-based boron-containing gas.

In addition, a reactant which differs in chemical structure from the precursor, e.g., a borazine-ring-skeleton-containing gas which is a reaction gas, may be supplied from the gas supply pipes 232b and 232c into the process chamber 201 through the MFCs 241b and 241c, the valves 243b and 243c, the nozzles 249b and 249c, and the buffer chamber 237. As the borazine-ring-skeleton-containing gas, it may be possible to use, e.g., a gas containing a borazine ring skeleton and an organic ligand, namely an organic borazine-based gas.

As the organic borazine-based gas, it may be possible to use, e.g., a gas containing an alkyl borazine compound which is an organic borazine compound. The organic borazine-based gas may be referred to as a borazine compound gas or a borazine-based gas.

Figure 12A:
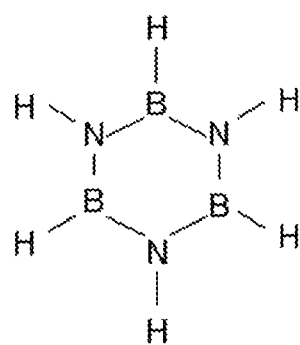
FIG. 12A is a view showing a chemical structural formula of borazine.
Figure 12B:
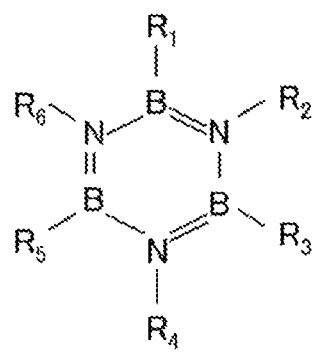
FIG. 12B is a view showing a chemical structural formula of a borazine compound.

As used herein, borazine is a heterocyclic compound composed of three elements, B, N and H. Borazine may be represented by a composition formula of $B_3H_6N_3$ and may be denoted as a chemical structural formula shown in FIG. 12A. A borazine compound is a compound which includes a borazine ring skeleton (also referred to as a "borazine skeleton") constituting a borazine ring containing three B atoms and three N atoms. The organic borazine compound is a borazine compound containing C, and may also be referred to as a borazine compound containing a C-containing ligand, namely an organic ligand. The alkyl borazine compound is a borazine compound containing an alkyl group and may be referred to as a borazine compound containing an alkyl group as an organic ligand. The alkyl borazine compound is a compound in which at least one of six H atoms contained in borazine is substituted with hydrocarbon containing one or more C atoms, and may be denoted as a chemical structural formula shown in FIG. 12B. In this case, each of $R_1$ to $R_6$ in the chemical structural formula shown in FIG. 12B is a H atom or an alkyl group containing one to four C atoms, $R_1$ to $R_6$ may be the same kind of alkyl group or may be different kinds of alkyl groups. However, not all of $R_1$ to $R_6$ should be H. The alkyl borazine compound may refer to a substance including a borazine ring skeleton, which constitutes a borazine ring, and contains B, N, H, and C. Further, the alkyl borazine compound may refer to a substance having a borazine ring skeleton and containing an alkyl ligand. In addition, each of $R_1$ to $R_6$ may be an H atom, or an alkenyl group or an alkynyl group containing one to four C atoms. $R_1$ to $R_6$ may be the same kind of an alkenyl group or an alkynyl group, or may be different kinds of alkenyl groups or alkenyl groups. However, not all of $R_1$ to $R_6$ should be H.

The borazine-based gas acts as a B source, an N source and a C source in a substrate processing procedure, which will be described later.

Figure 12C:
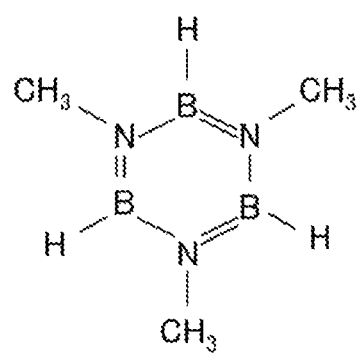
FIG. 12C is a view showing a chemical structural formula of n,n',n"-trimethylborazine.
Figure 12D:
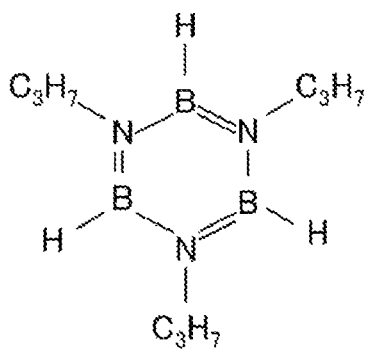
FIG. 12D is a view showing a chemical structural formula of n,n',n"-tri-n-propylborazine.

As the borazine-based gas, it may be possible to use, e.g., an n, n', n"-trimethylborazine (abbreviation: TMB) gas; an n, n', n"-triethylborazine (abbreviation: TEB) gas; an n, n', n"-tri-n-propylborazine (abbreviation: TPB) gas; an n, n', n"-triisopropylborazine (abbreviation: TIPB) gas; an n, n', n"-tri-n-butylborazine (abbreviation: TBB) gas; an n, n', n"-triisobutylborazine (abbreviation: TIBB) gas, or the like. TMB is a borazine compound in which $R_1$, $R_3$, and $R_5$ of the chemical structural formula shown in FIG. 12B are H atoms while $R_2$, $R_4$, and $R_6$ of the chemical structural formula are methyl groups. TMB may be denoted as a chemical structural formula shown in FIG. 12C. TEB is a borazine compound in which $R_1$, $R_3$, and $R_5$ of the chemical structural formula shown in FIG. 12B are H atoms while $R_2$, $R_4$, and $R_6$ of the chemical structural formula are ethyl groups. TPB is a borazine compound in which $R_1$, $R_3$, and $R_5$ of the chemical structural formula shown in FIG. 12B are H atoms while $R_2$, $R_4$, and $R_6$ of the chemical structural formula are propyl groups. TPB may be denoted as a chemical structural formula shown in FIG. 12D. TIPB is a borazine compound in which $R_1$, $R_3$, and $R_5$ of the chemical structural formula shown in FIG. 12B are H atoms while $R_2$, $R_4$, and $R_6$ of the chemical structural formula are isopropyl groups. TIBB is a borazine compound in which $R_1$, $R_3$, and $R_5$ of the chemical structural formula shown in FIG. 12B are H atoms while $R_2$, $R_4$, and $R_6$ of the chemical structural formula are isobutyl groups.

In the case of using a borazine compound such as TMB or the like, which is in a liquid state under room temperature and atmospheric pressure, the borazine compound in a liquid state is vaporized by a vaporization system such as a vaporizer or a bubbler, and is supplied as a borazine-based gas (e.g., a TMB gas).

A reactant which differs in chemical structure from the precursor, e.g., a carbon-containing gas which is a reaction gas, may be supplied from the gas supply pipe 232d into the process chamber 201 through the MFC 241d, the valve 243d, the gas supply pipe 232c, and the nozzle 249c. As the carbon-containing gas, it may be possible to use, e.g., a hydrocarbon-based gas. The hydrocarbon-based gas may be referred to as a substance consisting of only two elements C and H. The hydrocarbon-based gas acts as a C source in a substrate processing procedure, which will be described later. As the hydrocarbon-based gas, it may be possible to use, e.g., a propylene ($C_3H_6$) gas.

An inert gas, e.g., a nitrogen ($N_2$) gas, is supplied from the gas supply pipes 232e to 232g into the process chamber 201 through the MFCs 241e to 241g, the valves 243e to 243g, the gas supply pipes 232a to 232c, the nozzles 249a to 249c, and the buffer chamber 237. The inert gas supplied through the gas supply pipes 232e to 232g acts as a purge gas or a carrier gas. Further, the inert gas supplied through the gas supply pipe 232b is plasma-excited within the buffer chamber 237. Thereafter, the plasma-excited inert gas is supplied into the process chamber 201 and is mixed with the reactant which is supplied into the process chamber 201 from the nozzle 249c. Thus, the inert gas acts as an exciting (activating) gas, i.e., a reaction promoting gas, which indirectly excites (activates) the reactant or activates the uppermost surface of each of the wafers 200.

In the case of supplying the aforementioned precursor from the gas supply pipe 232a, a precursor supply system is mainly configured by the gas supply pipe 232a, the MFC 241a, and the valve 243a. The precursor supply system may include the nozzle 249a. The precursor supply system may be referred to as a precursor gas supply system. In the case of supplying an alkyl halosilane precursor gas from the gas supply pipe 232a, the precursor supply system may be referred to as an alkyl halosilane precursor supply system or an alkyl halosilane precursor gas supply system. In the case of supplying an alkylene halosilane precursor gas from the gas supply pipe 232a, the precursor supply system may be referred to as an alkylene halosilane precursor supply system or an alkylene halosilane precursor gas supply system.

In the case of supplying a nitrogen-containing gas from the gas supply pipe 232b, a nitrogen-containing gas supply system is mainly configured by the gas supply pipe 232b, the MFC 241b, and the valve 243b. In the case of supplying a nitrogen-containing gas from the gas supply pipe 232c, a nitrogen-containing gas supply system is mainly configured by the gas supply pipe 232c, the MFC 241c, and the valve 243c. The nitrogen-containing gas supply system may include the nozzles 249b and 249c, and the buffer chamber 237. The nitrogen-containing gas supply system may be referred to as a nitriding gas supply system or a nitriding agent supply system. In the case of supplying a hydrogen nitride-based gas from the gas supply pipes 232b and 232c, the nitrogen-containing gas supply system may be referred to as a hydrogen nitride-based gas supply system or a hydrogen nitride supply system.

In the case of supplying an oxygen-containing gas from the gas supply pipe 232b, an oxygen-containing gas supply system is mainly configured by the gas supply pipe 232b, the MFC 241b, and the valve 243b. Furthermore, in the case of supplying an oxygen-containing gas from the gas supply pipe 232c, an oxygen-containing gas supply system is mainly configured by the gas supply pipe 232c, the MFC 241c, and the valve 243c. The oxygen-containing gas supply system may also include the nozzles 249b and 249c, and the buffer chamber 237. The oxygen-containing gas supply system may be referred to as an oxidizing gas supply system or an oxidizing agent supply system.

In the case of supplying an N- and C-containing gas from the gas supply pipe 232b, a nitrogen- and carbon-containing gas supply system is mainly configured by the gas supply pipe 232b, the MFC 241b, and the valve 243b. Furthermore, in the case of supplying an N- and C-containing gas from the gas supply pipe 232c, a nitrogen- and carbon-containing gas supply system is mainly configured by the gas supply pipe 232c, the MFC 241c, and the valve 243c. The nitrogen- and carbon-containing gas supply system may also include the nozzles 249b and 249c, and the buffer chamber 237. In the case of supplying an amine-based gas from the gas supply pipes 232b and 232c, the nitrogen- and carbon-containing gas supply system may be referred to as an amine-based gas supply system or an amine supply system. The N- and C-containing gas is a nitrogen-containing gas or a carbon-containing gas. Thus, the nitrogen- and carbon-containing gas supply system may be included in a nitrogen-containing gas supply system or a carbon-containing gas supply system, which will be described later.

In the case of supplying a boron-containing gas from the gas supply pipe 232b, a boron-containing gas supply system is mainly configured by the gas supply pipe 232b, the MFC 241b, and the valve 243b. Furthermore, in the case of supplying a boron-containing gas from the gas supply pipe 232c, a boron-containing gas supply system is mainly configured by the gas supply pipe 232c, the MFC 241c, and the valve 243c. The boron-containing gas supply system may also include the nozzles 249b and 249c, and the buffer chamber 237. In the case of supplying a borane-based gas from the gas supply pipes 232b and 232c, the boron-containing gas supply system may be referred to as a borane-based gas supply system or a borane compound supply system. In the case of supplying a borazine-based gas from the gas supply pipes 232b and 232c, the boron-containing gas supply system may be referred to as a borazine-based gas supply system, an organic borazine-based gas supply system, or a borazine compound supply system. The borazine-based gas is an N- and C-containing gas, which is also a nitrogen-containing gas or a carbon-containing gas. Thus, the borazine-based gas supply system may be included in a nitrogen- and carbon-containing gas supply system, a nitrogen-containing gas supply system or a carbon-containing gas supply system.

In the case of supplying a carbon-containing gas from the gas supply pipe 232d, a carbon-containing gas supply system is mainly configured by the gas supply pipe 232d, the MFC 241d, and the valve 243d. The carbon-containing gas supply system may also include the nozzle 249c disposed at a downstream side of a connection portion of the gas supply pipe 232c and the gas supply pipe 232d. In the case of supplying a hydrocarbon-based gas from the gas supply pipe 232d, the carbon-containing gas supply system may be referred to as a hydrocarbon-based gas supply system or a hydrocarbon supply system.

One or all of the nitrogen-containing gas supply system, the oxygen-containing gas supply system, the nitrogen- and carbon-containing gas supply system, the boron-containing gas supply system, and the carbon-containing gas supply system may be referred to as a reactant supply system or a reaction gas supply system.

Furthermore, an inert gas supply system is mainly configured by the gas supply pipes 232e to 232g, the MFCs 241e to 241g, and the valves 243e to 243g. The inert gas supply system may also include the downstream side of a connection portion where the gas supply pipe 232a is connected to the gas supply pipe 232e, the downstream side of a connection portion where the gas supply pipe 232b is connected to the gas supply pipe 232f, the downstream side of a connection portion where the gas supply pipe 232c is connected to the gas supply pipe 232g, the nozzles 249a to 249c, and the buffer chamber 237. The inert gas supply system may be referred to as a purge gas supply system or a carrier gas supply system. In the case of supplying a plasma-excited inert gas from the buffer chamber 237, the inert gas supply system mainly configured by the gas supply pipe 232f, the MFC 241f, and the valve 243f may be referred to as an exciting (activating) gas supply system or a reaction promoting gas supply system. In this case, the nozzle 249b, the downstream side of the connection portion where the gas supply pipe 232b is connected to the gas supply pipe 232f, and the buffer chamber 237, may be included in the exciting gas supply system.

Figure 2:
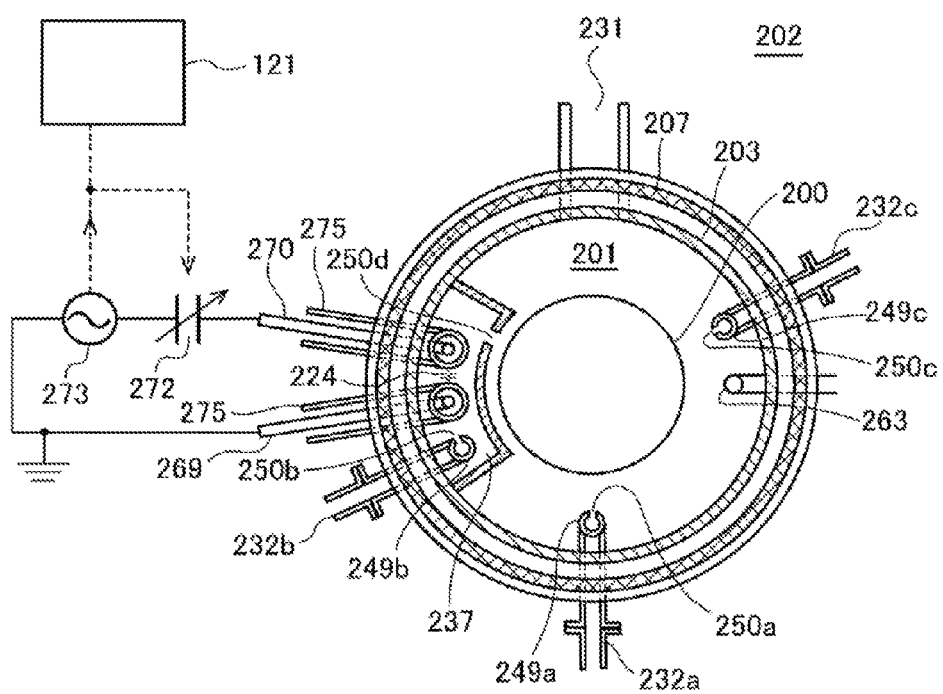
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

In the buffer chamber 237, as illustrated in FIG. 2, two rod-shaped electrodes 269 and 270, which are made of a conductor and have an elongated structure, are disposed along the stacking direction of the wafers 200 to span from the lower portion of the reaction tube 203 to the upper portion thereof. Each of the rod-shaped electrodes 269 and 270 is installed parallel to the nozzle 249b. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to the ground having a reference electric potential. By applying high-frequency (RF) power from the high-frequency power source 273 to between the rod-shaped electrodes 269 and 270 via the matcher 272, plasma is generated in a plasma generation region 224 between the rod-shaped electrodes 269 and 270. A plasma source as a plasma generator (plasma generating unit) is mainly configured by the rod-shaped electrodes 269 and 270, and the electrode protection tubes 275. The matcher 272 and the high-frequency power source 273 may also be included in the plasma source. As will be described later, the plasma source functions as an exciting unit (an activating mechanism) that plasma-excites a gas, namely excites (activates) a gas into a plasma state.

Each of the electrode protection tubes 275 has a structure in which each of the rod-shaped electrodes 269 and 270 can be inserted into the buffer chamber 237 while keeping each of the rod-shaped electrodes 269 and 270 isolated from the internal atmosphere of the buffer chamber 237. If an oxygen concentration within each of the electrode protection tubes 275 is substantially equal to an oxygen concentration in the ambient air (atmosphere), each of the rod-shaped electrodes 269 and 270 inserted into the electrode protection tubes 275 may be oxidized by the heat generated from the heater 207. By charging the interior of the electrode protection tubes 275 with an inert gas such as a $N_2$ gas or the like, or by purging the interior of the electrode protection tubes 275 with an inert gas such as a $N_2$ gas or the like through the use of an inert gas purge mechanism, it is possible to reduce the oxygen concentration within the electrode protection tubes 275, thereby preventing oxidation of the rod-shaped electrodes 269 and 270.

An exhaust pipe 231 for exhausting an internal atmosphere of the process chamber 201 is connected to the reaction tube 203. A connection portion of the reaction tube 203 connected to the exhaust pipe 231 is configured as an exhaust port configured to exhaust the internal atmosphere of the process chamber 201. A vacuum pump 246 as a vacuum exhaust device is connected to the exhaust pipe 231 via a pressure sensor 245, which is a pressure detector (pressure detecting unit) for detecting the internal pressure of the process chamber 20, and an Auto Pressure Controller (APC) valve 244, which is a pressure regulator (pressure regulating unit). The APC valve 244 is configured to perform or stop vacuum exhaust for the process chamber 201 by opening or closing the valve while keeping the vacuum pump 246 in an actuated state and is also configured to regulate the internal pressure of the process chamber 201 by adjusting an opening degree of the valve pursuant to the pressure information detected by the pressure sensor 245 while keeping the vacuum pump 246 in an actuated state. An exhaust system is mainly configured by the exhaust pipe 231, the APC valve 244, and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a vertical lower side. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217, which will be described later, is installed at the opposite side of the seal cap 219 from the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers 200, in such a state that the wafers 200 are arranged in a horizontal posture and in multiple stages along a vertical direction, with the centers of the wafers 200 concentrically aligned with one another. That is to say, the boat 217 is configured to arrange the wafers 200 in a spaced-apart relationship with one another. The boat 217 is made of a heat resistant material such as quartz or SiC. Heat insulating plates 218 made of heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of a heat resistant material such as quartz or SiC may be installed below the boat 217.

A temperature sensor 263 serving as a temperature detector is installed in the reaction tube 203. Based on the temperature information detected by the temperature sensor 263, the state of supplying electronic power to the heater 207 is adjusted such that the interior of the process chamber 201 has a desired temperature distribution. Similar to the nozzles 249a to 249c, the temperature sensor 263 is formed in an L-shape. The temperature sensor 263 is installed along the inner wall of the reaction tube 203.

Figure 3:
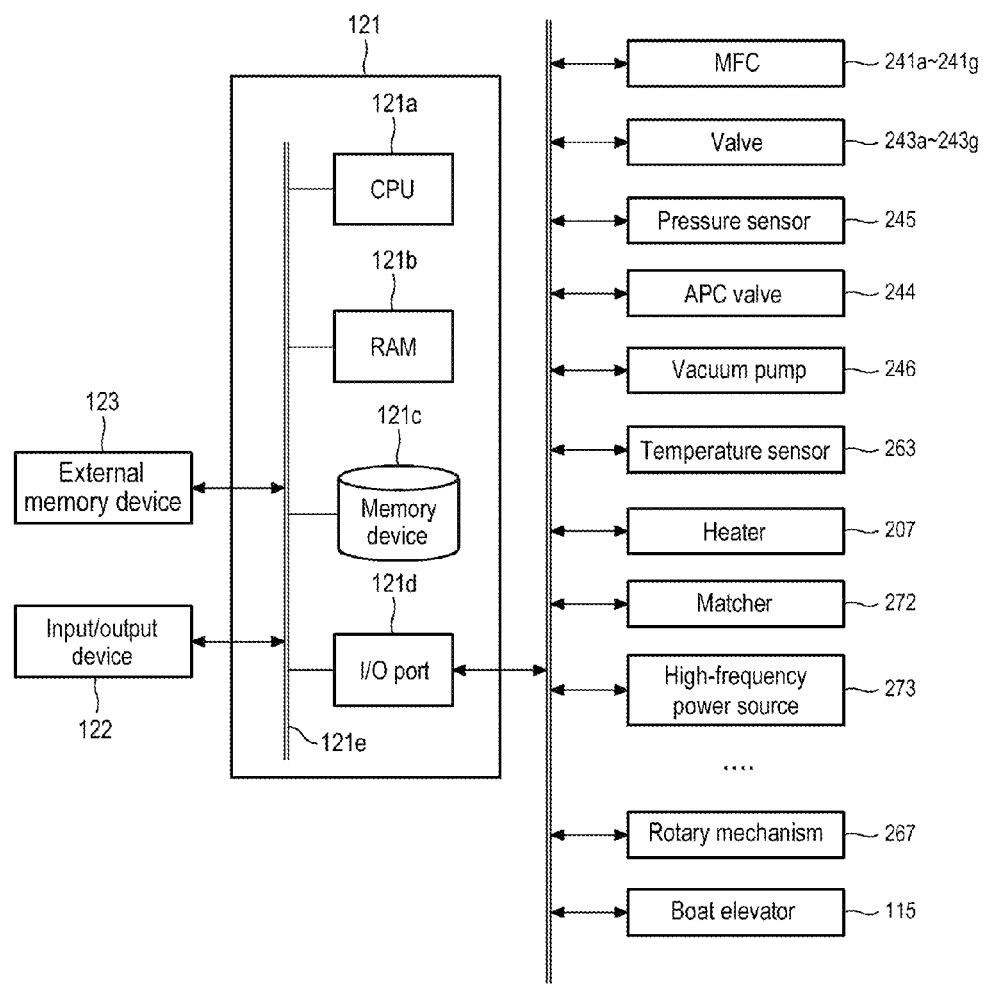
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control unit (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling the operation of a substrate processing apparatus, or a process recipe in which substrate processing sequences or conditions to be described later are written, is readably stored in the memory device 121c. The process recipe is configured to enable the controller 121 to execute each sequence in the substrate processing procedure, which will be described later, to obtain a predetermined result. The process recipe functions as a program. Hereinafter, the process recipe or the control program is also generally and simply referred to as a "program." When the term "program" is used herein, it may indicate a case of including only the process recipe, a case of including only the control program, or a case of including both the process recipe and the control program. In addition, the RAM 121b is configured as a memory area (work area) in which a program or data read by the CPU 121a is temporarily stored.

The I/O port 121d is connected to the MFCs 241a to 241g, the valves 243a to 243g, the pressure sensor 245, the APC valve 244, the vacuum pump 246, the heater 207, the temperature sensor 263, the high-frequency power source 273, the matcher 272, the rotary mechanism 267, the boat elevator 115, and the like.

The CPU 121a is configured to read the control program from the memory device 121c and execute the same. The CPU 121a is also configured to read the process recipe from the memory device 121c according to an input of an operation command from the input/output device 122. In addition, the CPU 121a is configured to control the flow rate adjusting operation of various kinds of gases by the MFCs 241a to 241g, the opening/closing operation of the valves 243a to 243g, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the power supply operation of the high-frequency power source 273, the impedance adjusting operation performed by the matcher 272, the operation of rotating the boat 217 and adjusting the rotation speed of the boat 217 with the rotary mechanism 267, the operation of moving the boat 217 up and down with the boat elevator 115, and the like, according to the contents of the process recipe read as above.

The controller 121 is not limited to being configured as a dedicated computer but may be configured as a general-purpose computer. For example, the controller 121 according to the present embodiment may be configured by preparing an external memory device 123 (for example, a magnetic tape, a magnetic disc such as a flexible disc or a hard disc, an optical disc such as a CD or a DVD, a magneto-optical disc such as an MO or the like, a semiconductor memory such as a USB memory or a memory card), which stores the aforementioned program, and installing the program on the general-purpose computer using the external memory device 123. However, means for providing the program to the computer is not limited to the case in which the program is provided through the external memory device 123. For example, the program may be supplied using communication means such as the Internet or a dedicated line, rather than through the external memory device 123. The memory device 121c or the external memory device 123 is configured as a non-transitory computer-readable recording medium. Hereinafter, the means for supplying the program will be generally and simply referred to as a "recording medium." When the term "recording medium" is used herein, it may indicate a case of including only the memory device 121c, a case of including only the external memory device 123, or a case of including both the memory device 121c and the external memory device 123.

(2) Substrate Processing Process

An example of a procedure for forming a thin film on a substrate, which is one of the procedures for manufacturing a semiconductor device through the use of the above-described substrate processing apparatus, will be described with reference to FIG. 4. In the following descriptions, the operations of the respective units or parts constituting the substrate processing apparatus are controlled by the controller 121.

Figure 4:
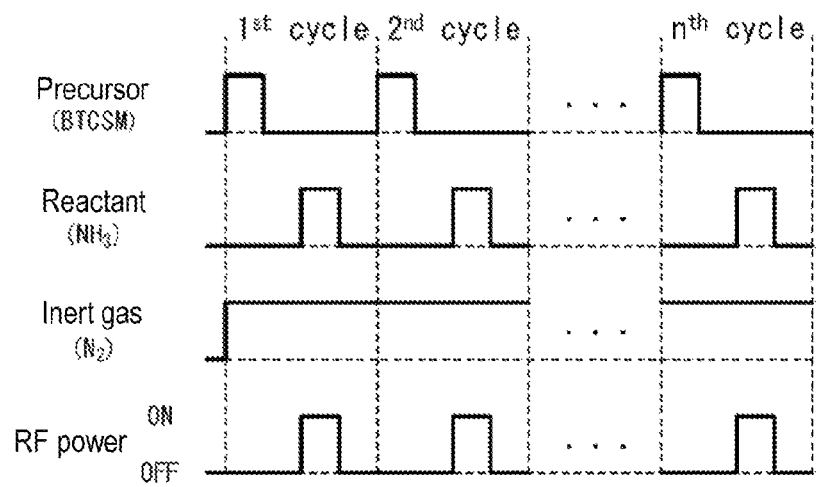
FIG. 4 is a view illustrating gas supply and plasma power supply timings in a film forming sequence according to one embodiment of the present disclosure.

In a film forming sequence shown in FIG. 4, a silicon carbonitride film (SiCN film) as a film containing Si, C, and N is formed on a wafer 200 by performing, a predetermined number of times (n times), a cycle that non-simultaneously (without synchronization) performs: a step of forming a first solid layer having a thickness of more than one atomic layer and several atomic layers or less and containing Si—C bonds by supplying a BTCSM gas as a precursor to the wafer 200 as a substrate under a condition in which the BTCSM gas having Si—C bonds is pyrolyzed and in which at least some of the Si—C bonds included in the BTCSM gas are maintained without being broken; and a step of forming a second solid layer by supplying a plasma-excited $NH_3$ gas as a plasma-excited N-containing reactant to the wafer 200 and by modifying the first solid layer.

As used herein, the phrase "performing a cycle a predetermined number of times" means that the cycle is performed once or a plurality of times. That is to say, the phrase may also mean that the cycle is performed one or more times. FIG. 4 illustrates an example in which the cycle is repeated n times.

As used herein, the term "wafer" may refer to "a wafer itself" or "a laminated body (a collected body) of a wafer and a predetermined layer or a film formed on a surface of the wafer", i.e., a wafer including a predetermined layer or a film formed on the surface thereof. In addition, as used herein, the phrase "a surface of a wafer" may refer to "a surface (exposed surface) of a wafer itself" or "a surface of a predetermined layer or a film formed on a wafer, namely an uppermost surface of the wafer as a laminated body".

As such, as used herein, the expression "a predetermined gas is supplied to a wafer" may mean that "a predetermined gas is directly supplied to a surface (exposed surface) of a wafer itself" or that "a predetermined gas is supplied to a layer or a film formed on a wafer, namely to an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or a film formed on a wafer, namely on an uppermost surface of a wafer as a laminated body."

In addition, the term "substrate" as used herein may be synonymous with the term "wafer." In this case, the terms "wafer" and "substrate" may be used interchangeably in the above descriptions.

(Wafer Charging and Boat Loading)

The wafers 200 are charged on the boat 217 (wafer charging). Thereafter, as illustrated in FIG. 1, the boat 217 charged with the wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

The interior of the process chamber 201, namely the space in which the wafers 200 exist, is vacuum-exhausted (exhausted into a reduced pressure) by the vacuum pump 246 so as to reach a desired pressure (a desired vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 reaches a desired temperature distribution. In addition, the heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(SiCN Film Forming Process)

Next, the following two steps, i.e., Steps 1 and 2, are sequentially performed.

[Step 1]
(BTCSM Gas Supply)

In a state in which the APC valve 244 is opened at a predetermined opening degree, the valve 243a is opened to allow a BTCSM gas to flow through the gas supply pipe 232a. The BTCSM gas is flow rate-adjusted by the MFC 241a. The BTCSM gas is supplied from the gas supply holes 250a into the process chamber 201 and is exhausted from the exhaust pipe 231. At this time, the BTCSM gas is supplied to the wafer 200. At the same time, the valve 243e is opened to allow a $N_2$ gas to flow through the gas supply pipe 232e. The $N_2$ gas is flow rate-adjusted by the MFC 241e. The flow rate-adjusted $N_2$ gas is supplied into the process chamber 201 together with the BTCSM gas and is exhausted from the exhaust pipe 231.

In order to prevent the BTCSM gas from infiltrating into the nozzles 249b and 249c and the buffer chamber 237, the valves 243f and 243g are opened to allow the $N_2$ gas to flow through the gas supply pipes 232f and 232g. The $N_2$ gas is supplied into the process chamber 201 through the gas supply pipe 232b and 232c, the nozzles 249b and 249c, and the buffer chamber 237 and is exhausted from the exhaust pipe 231.

In this operation, the APC valve 244 is appropriately adjusted such that the internal pressure of the process chamber 201 falls within a range of, e.g., 1 to 4,000 Pa, specifically, 67 to 2,666 Pa, or more specifically, 133 to 1,333 Pa. The supply flow rate of the BTCSM gas controlled by the MFC 241a is set to fall within a range of, e.g., 1 to 2,000 sccm, specifically, 10 to 1,000 sccm. Each of the supply flow rates of the $N_2$ gas controlled by the MFCs 241e to 241g is set to fall within a range of, e.g., 100 to 10,000 sccm. The time period for supplying the BTCSM gas into the process chamber 201, namely the gas supply time (irradiation time) in which the BTCSM gas is supplied to the wafer 200, is set to fall within a range of, e.g., 1 to 120 seconds, specifically, 1 to 60 seconds. The temperature of the heater 207 is set such that the temperature of the wafer 200 falls within a range of, e.g., 400 degrees C. or more and 800 degrees C. or less, more specifically, 500 degrees C. or more and 700 degrees C. or less, or still more specifically, 600 degrees C. or more and 700 degrees C. or less.

If the temperature of the wafer 200 is lower than 400 degrees C., BTCSM is hard to be chemisorbed onto the wafer 200, eventually making it impossible to obtain a practical deposition rate. By setting the temperature of the wafer 200 at a temperature equal to or higher than 400 degrees C., it becomes possible to have BTCSM chemisorbed onto the wafer 200 and the increase the deposition rate. By setting the temperature of the wafer 200 at 500 degrees C. or more, it becomes possible to have BTCSM sufficiently adsorbed onto the wafer 200 and to obtain a sufficient deposition rate. By setting the temperature of the wafer 200 at 600 degrees C. or more, specifically, at 650 degrees C. or more, it becomes possible to have BTCSM further sufficiently adsorbed onto the wafer 200 and to obtain a further sufficient deposition rate.

If the temperature of the wafer 200 exceeds 800 degrees C., a CVD reaction may be made too strong (an excessive gas phase reaction may be generated). In this case, the film thickness uniformity may deteriorate with ease and may be hard to control. By setting the temperature of the wafer 200 at 800 degrees C. or less, a suitable gas phase reaction may be generated. In this way, the deterioration of the film thickness uniformity can be suppressed, and thus the film thickness uniformity can be controlled. In particular, if the temperature of the wafer 200 is set at 700 degrees C. or less, the surface reaction becomes more dominant than the gas phase reaction. Thus, it becomes easy to secure the film thickness uniformity and to control the film thickness uniformity.

Accordingly, the temperature of the wafer 200 may be set to fall within a range of 400 degrees C. or more and 800 degrees C. or less, more specifically, 500 degrees C. or more and 700 degrees C. or less, or still more specifically, 600 degrees C. or more and 700 degrees C. or less. The BTCSM gas is low in degradability (low in reactivity) and is high in pyrolysis temperature. Therefore, even if a film is formed in a relatively-high temperature zone of, e.g., 650 to 800 degrees C., it is possible to generate a suitable gas phase reaction. Thus, it becomes possible to suppress generation of an excessive gas phase reaction and to suppress resultant generation of particles.

By supplying the BTCSM gas to the wafer 200 under the aforementioned conditions, at least a part of the BTCSM gas supplied into the process chamber 201 is pyrolyzed (autolyzed). In the process chamber 201, a gas phase reaction, i.e., a chemical vapor deposition (CVD) reaction, of the BTCSM gas is properly generated. As a result, a first solid layer, e.g., a Si-containing layer having a thickness of more than one atomic layer and several atomic layers or less and containing C and Cl, is formed (deposited) on the wafer 200 (on the base film of the surface of the wafer 200).

In this case, in order to increase the reaction efficiency, when the BTCSM gas is exhausted from the interior of the process chamber 201 while supplying the BTCSM gas into the process chamber 201, the exhaust rate of the BTCSM gas from the interior of the process chamber 201 may be kept lower than the supply rate of the BTCSM gas into the process chamber 201. Furthermore, the exhaust system may be blocked by fully closing the APC valve 244 and the BTCSM gas may be confined in the process chamber 201. In this way, by keeping the exhaust rate of the BTCSM gas from the interior of the process chamber 201 lower than the supply rate of the BTCSM gas into the process chamber 201 or by confining the BTCSM gas in the process chamber 201, it is possible to sufficiently secure the stay time of the BTCSM gas within the process chamber 201, namely the heating time required in pyrolyzing the BTCSM gas. Furthermore, as compared with a case where the exhaust rate of the BTCSM gas from the interior of the process chamber 201 is kept equal to or higher than the supply rate of the BTCSM gas into the process chamber 201, it is possible to rapidly increase the internal pressure of the process chamber 201 to a high pressure and to maintain the internal pressure of the process chamber 201 at the high pressure. This makes it possible to enhance the reaction efficiency and to appropriately promote the pyrolysis of the BTCSM gas. The BTCSM gas is low in degradability (low in reactivity) and is high in pyrolysis temperature. However, by keeping the exhaust rate of the BTCSM gas from the interior of the process chamber 201 lower than the supply rate of the BTCSM gas into the process chamber 201 or by confining the BTCSM gas in the process chamber 201, it becomes possible to appropriately promote the pyrolysis of the BTCSM gas.

The first solid layer does not become a non-solid layer such as an adsorption layer of the BTCSM gas or the like but becomes a deposition layer, i.e., a solid layer, which is formed by pyrolyzing the BTCSM gas and consequently depositing Si, C and Cl contained in the BTCSM gas. The first solid layer may be referred to as a Si layer containing C and Cl or a SiC layer containing Cl. Although the first solid layer may include a chemisorption layer of BTCSM, the first solid layer becomes a layer which does not include a physical adsorption layer of the BTCSM gas, or a layer which scarcely includes a physical adsorption layer of the BTCSM gas. As compared with the physical adsorption layer of the BTCSM gas, i.e., the non-solid layer, which is formed under, e.g., a condition in which the BTCSM gas is physically adsorbed onto the wafer 200, the first solid layer has strong bonds between atoms constituting the layer and becomes a stable layer. Furthermore, as compared with the layer formed of only a chemisorption layer of BTCSM, the first solid layer has strong bonds between atoms constituting the layer and becomes a stable layer. It may be advantageous to form a solid layer, i.e., a deposition layer formed of deposited Si, C and Cl, on the wafer 200 than to form a non-solid layer, i.e., an adsorption layer of the BTCSM gas, on the wafer 200. By doing so, it is possible to increase the thickness of the layer formed at Step 1, namely the thickness of the layer formed per one cycle, and to increase the cycle rate, namely the deposition rate.

The Si which constitutes the first solid layer includes not only Si whose bond to C or Cl is not completely broken, but also Si whose bond to C or Cl is completely broken.

Under the aforementioned conditions, during the course of formation of the first solid layer, at least some of the Si—C bonds contained in the BTCSM gas are maintained without being broken and are introduced into the first solid layer as they are. Thus, the first solid layer becomes a layer which is larger in the percentage of the Si—C bonds contained in the layer than the layer formed under the condition in which the Si—C bonds contained in the BTCSM gas are easily broken, e.g., under the condition in which plasma is used. Accordingly, the first solid layer becomes a stable layer which contains a larger amount of strong Si—C bonds. Since the percentage of the Si—C bonds contained in the first solid layer is large, the first solid layer becomes a layer from which C is hardly desorbed, namely a layer which has a low probability of desorption of C.

Since the BTCSM gas includes a plurality of (two) Si—C bonds in one molecule (in the chemical structural formula thereof), it becomes easier to introduce the Si—C bonds into the first solid layer. For example, under the aforementioned condition in which the pyrolysis reaction of the BTCSM gas is generated, even if one Si—C bond of a Si—C—Si bond of the BTCSM gas is broken, the other Si—C bond is maintained without being broken and is introduced into the first solid layer as it is. Thus, as compared with the layer formed using a precursor gas having only one Si—C bond, the first solid layer has a large percentage of Si—C bonds contained therein and contains a large amount of strong Si—C bonds. Accordingly, the first solid layer becomes a stable layer, namely a layer having a low probability of desorption of C.

By performing the formation of the first solid layer under the condition in which the gas phase reaction, i.e., the CVD reaction, of the BTCSM gas is generated, the thickness of the first solid layer can be made larger than the thickness of the chemisorption layer (saturated adsorption layer) of BTCSM formed under the condition in which the chemisorption of BTCSM onto the wafer 200 is saturated. That is to say, the thickness of the first solid layer can be made larger than the thickness of the chemisorption layer of BTCSM formed by self-limiting the chemisorption of BTCSM onto the wafer 200. The thickness of the first solid layer formed on the wafer 200 may be, e.g., a thickness exceeding one atomic layer. By setting the thickness of the first solid layer at the thickness exceeding one atomic layer, it is possible to make the absolute amount of the Si—C bonds contained in the layer larger than that of the saturated adsorption layer of BTCSM. Thus, the first solid layer can be made a stable layer which contains a larger amount of strong Si—C bonds and which has stronger bonds between atoms constituting the layer. It is also possible to reduce the probability of desorption of C from the layer.

If the thickness of the first solid layer formed on the wafer 200 exceeds several atomic layers, the modifying action at Step 2, which will be described later, does not affect the entirety of the first solid layer.

Accordingly, the thickness of the first solid layer may be set to fall within a range of more than one atomic layer to several atomic layers or less. By setting the thickness of the first solid layer at, e.g., two to three atomic layers or less, specifically, two atomic layers or less, it is possible to relatively increase the action of the modifying reaction at Step 2, which will be described later, and to shorten the time required in the modifying reaction at Step 2. It is also possible to shorten the time required in forming the first solid layer at Step 1. As a result, the processing time per cycle can be shortened, and the total processing time can also be shortened. That is to say, the deposition rate can be increased. In addition, if the thickness of the first solid layer is set at two to three atomic layers or less, specifically, two atomic layers or less, it is possible to improve the controllability of the film thickness uniformity.

(Residual Gas Removal)

After the first solid layer is formed, the valve 243a is closed to stop the supply of the BTCSM gas. In this case, while keeping the APC valve 244 opened, the interior of the process chamber 201 is evacuated by the vacuum pump 246. The BTCSM gas remaining within the process chamber 201, which has not reacted or which has contributed to the formation of the first solid layer, is removed from the interior of the process chamber 201. At this time, the valves 243e to 243g are kept opened to maintain the supply of the $N_2$ gas into the process chamber 201. The $N_2$ gas acts as a purge gas. This makes it possible to effectively remove the BTCSM gas remaining within the process chamber 201, which has not reacted or which has contributed to the formation of the first solid layer, from the interior of the process chamber 201.

In this operation, the gas remaining within the process chamber 201 may not be completely removed and the interior of the process chamber 201 may not be completely purged. If the amount of the gas remaining within the process chamber 201 is small, no adverse effect is generated at Step 2 which will be subsequently performed. The flow rate of the $N_2$ gas supplied into the process chamber 201 need not be made large. For example, the amount of the $N_2$ gas to be supplied into the process chamber 201 may be substantially equal to the volume of the reaction tube 203 (the process chamber 201) such that a purge operation is performed without causing an adverse effect at Step 2. As such, by not completely purging the interior of the process chamber 201, it is possible to shorten the purge time and to improve the throughput. It is also possible to suppress the consumption of the $N_2$ gas to a necessary minimum level.

As the precursor gas, in addition to the BTCSM gas, it is possible to use, e.g., a BTCSE gas, a TCDMDS gas, a DCTMDS gas or an MCPMDS gas. As the inert gas, in addition to the $N_2$ gas, it is possible to use, e.g., a rare gas such as an Ar gas, a He gas, a Ne gas, a Xe gas or the like.

[Step 2]
(NH₃ Gas Supply)

After Step 1 is completed, a plasma-excited NH₃ gas is supplied to the wafer 200 exiting within the process chamber 201.

At this step, the NH₃ gas is allowed to flow through the gas supply pipe 232b. That is to say, the APC valve 244 is opened at a predetermined opening degree. In this state, the valve 243b is opened and the NH₃ gas is allowed to flow through the gas supply pipe 232b. The opening/closing control of the valves 243e to 243g is executed in the same or similar manner as the opening/closing control of the valves 243e to 243g executed at Step 1.

In this case, the supply flow rate of the NH₃ gas controlled by the MFC 241b is set to fall within a range of, e.g., 100 to 10,000 sccm. The high-frequency power (RF power) applied to between the rod-shaped electrodes 269 and 270 is set at electric power which falls within a range of, e.g., 50 to 1,000 W. The internal pressure of the process chamber 201 is set to fall within a range of, e.g., 1 to 500 Pa, specifically, 1 to 100 Pa. The partial pressure of the NH₃ gas within the process chamber 201 is set to fall within a range of, e.g., 0.01 to 495 Pa, specifically, 0.01 to 99 Pa. By using the plasma, it becomes possible to activate the NH₃ gas even when the internal pressure of the process chamber 201 is set to fall within the relatively low pressure zone. The time period in which the active species obtained by plasma-exciting the NH₃ gas are supplied to the wafer 200, namely the gas supply time (irradiation time), is set to fall within a range of, e.g., 1 to 120 seconds, specifically, 1 to 60 seconds. Other processing conditions may be the same as or similar to the processing conditions of Step 1 described above.

By supplying the plasma-excited NH₃ gas to the wafer 200 under the aforementioned conditions, at least a portion of the first solid layer is nitrided (modified). As the first solid layer is modified, a layer containing Si, C and N, namely a SiCN layer, as a second solid layer is formed on the wafer 200.

When forming the second solid layer, at least some of the Si—C bonds contained in the first solid layer are maintained without being broken and are introduced into the second solid layer (remain in the second solid layer) as they are. The first solid layer is a stable layer which contains a large amount of strong Si—C bonds and which has strong bonds between atoms constituting the layer, namely a layer which has a low probability of desorption of C. Therefore, even when the plasma-excited NH₃ gas is used, it is possible to suppress desorption of C from the layer. For that reason, the second solid layer becomes a layer which is larger in the percentage of the Si—C bonds contained in the layer than the layer obtained by, for example, modifying a physical adsorption layer or a saturated adsorption layer of BTCSM with a plasma-excited NH₃ gas. Thus, the second solid layer becomes a stable layer which contains a large amount of strong Si—C bonds and which has strong bonds between atoms constituting the layer. Since the percentage of the strong Si—C bonds contained in the layer is large and the bonds between atoms in the layer are strong, the second solid layer becomes a layer having a low probability of desorption of C.

When forming the second solid layer, the impurities such as Cl and the like contained in the first solid layer may become a gaseous substance containing at least Cl, during the course of the modifying reaction by the plasma-excited NH₃ gas. The gaseous substance is discharged from the interior of the process chamber 201. That is to say, the impurities such as Cl and the like contained in the first solid layer are extracted or desorbed from the first solid layer and are eventually separated from the first solid layer. As such, the second solid layer becomes a layer having a smaller amount of impurities such as Cl and the like than the first solid layer.

(Residual Gas Removal)

After the second solid layer is formed, the valve 243b is closed to stop the supply of the NH₃ gas. Furthermore, the application of the high-frequency power to between the rod-shaped electrodes 269 and 270 is stopped. Then, by virtue of the processing procedures similar to those of Step 1, the NH₃ gas remaining within the process chamber 201, which has not reacted or which has contributed to the formation of the second solid layer, or the reaction byproduct remaining within the process chamber 201, is removed from the interior of the process chamber 201. Similar to Step 1, the gas remaining within the process chamber 201 may not be completely removed.

As the nitrogen-containing gas (nitriding gas) used as the reactant, in addition to the NH₃ gas, it may be possible to use, e.g., a hydrogen nitride-based gas such as a diazene (N₂H₂) gas, a hydrazine (N₂H₄) gas, an N₃H₈ gas or the like, or a gas containing these compounds. As the inert gas, in addition to the N₂ gas, it may be possible to use, e.g., a rare gas such as an Ar gas, a He gas, a Ne gas, a Xe gas, or the like.

(Performing a Cycle a Predetermined Number of Times)

By performing, one or more times (a predetermined number of times), a cycle which non-simultaneously performs Steps 1 and 2 described above, namely by alternately performing Steps 1 and 2 one or more times, it is possible to form a SiCN film having a predetermined composition and a predetermined thickness on the wafer 200. The cycle mentioned above may be performed multiple tomes. That is to say, the thickness of the SiCN layer formed per one cycle may be set to become smaller than a desired film thickness and the above cycle may be repeated multiple times until the desired film thickness is obtained.

In the case where the cycle is performed multiple times, the expression "a predetermined gas is supplied to the wafer 200" at each step in at least a second cycle or subsequent cycles may mean that "a predetermined gas is supplied to a layer formed on the wafer 200, namely on the uppermost surface of the wafer 200 as a laminated body." The expression "a predetermined layer is formed on the wafer 200" may mean that "a predetermined layer is formed on a layer formed on the wafer 200, namely on the uppermost surface of the wafer 200 as a laminated body." The above definitions are the same as those described above. These definitions may also apply to each of modifications and other embodiments, which will be described later.

(Purge and Return to Atmospheric Pressure)

The valves 243e to 243g are opened. The N₂ gas is supplied into the process chamber 201 from each of the gas supply pipes 232e to 232g, and is exhausted through the exhaust pipe 231. The N₂ gas serves as a purge gas. Thus, the interior of the process chamber 201 is purged, and the residual gas or the reaction byproduct remaining within the process chamber 201 is removed from the interior of the process chamber 201 (purge). Thereafter, the internal atmosphere of the process chamber 201 is substituted with an inert gas (inert gas substitution), and the internal pressure of the process chamber 201 is returned to atmospheric pressure (return to atmospheric pressure).

(Boat Unloading and Wafer Discharging)

The seal cap 219 is moved down by the boat elevator 115 to open the lower end of the reaction tube 203. The processed wafers 200 supported by the boat 217 are unloaded from the lower end of the reaction tube 203 to the outside of the reaction tube 203 (boat unloading). Thereafter, the processed wafers 200 are discharged from the boat 217 (wafer discharging).

(3) Effects According to the Present Embodiment

According to the present embodiment, one or more effects may be achieved as follows.

(a) By performing the formation of the first solid layer under the condition in which the BTCSM gas is pyrolyzed, the first solid layer can be made a deposition layer formed by depositing Si, C and Cl, namely a solid layer, rather than a non-solid layer such as an adsorption layer of the BTCSM gas or the like. Thus, the first solid layer becomes a stable layer which has strong bonds between atoms constituting the layer.

Furthermore, by performing the formation of the first solid layer under the condition in which at least some of the Si—C bonds contained the BTCSM gas are maintained without being broken, the first solid layer can be made a layer which is large in the percentage of the Si—C bonds contained in the layer. Thus, the first solid layer can be made a stable layer which contains a large amount of strong Si—C bonds. Moreover, the first solid layer can be made a layer which has a low probability of desorption of C.

Furthermore, by using the precursor gas such as the BTCSM gas or the like which has a plurality of Si—C bonds in one molecule, the first solid layer can be made a layer which is larger in the percentage of the Si—C bonds contained in the layer. Thus, the first solid layer can be made a stable layer which contains a larger amount of strong Si—C bonds. Moreover, the first solid layer can be made a layer which has a lower probability of desorption of C.

Furthermore, by setting the thickness of the first solid layer at the thickness exceeding one atomic layer, it is possible to make the absolute amount of the Si—C bonds contained in the first solid layer larger than that of the saturated adsorption layer of BTCSM. Thus, the first solid layer can be made a stable layer which contains a larger amount of strong Si—C bonds and which has stronger bonds between atoms constituting the layer. Moreover, the first solid layer can be made a layer which has a lower probability of desorption of C.

As mentioned above, the first solid layer is a stable layer which contains a large amount of strong Si—C bonds and which has strong bonds between atoms constituting the layer, namely a layer which has a low probability of desorption of C. Therefore, even if the plasma-excited $NH_3$ gas is used as the reactant when forming the second solid layer, it is possible to suppress desorption of C from the first solid layer. As a result, the finally-formed SiCN film can be made a stable film which contains a large amount of strong Si—C bonds and which has strong bonds between atoms constituting the film. In addition, the finally-formed SiCN film can be made a film which has a low probability of desorption of C and which has a high C concentration. As a result, the SiCN film can be made a film which has a high HF resistance.

The layer (the physical adsorption layer, etc.) of BTCSM formed under the low temperature condition in which the BTCSM gas is not pyrolyzed is a non-solid layer and becomes an unstable layer which has relatively weak bonds between atoms constituting the layer, namely a layer which has a relatively high probability of desorption of C. The layer of BTCSM formed under the low temperature condition becomes a layer which is smaller in thickness, namely smaller in the absolute amount of the Si—C bonds contained in the layer, than the solid layer formed under the high temperature condition in which the BTCSM gas is pyrolyzed. Thus, if the layer of BTCSM formed under the low temperature condition is reacted with the plasma-excited $NH_3$ gas, desorption of C from the layer is easily generated and the amount of C remaining in the layer after the reaction is easily reduced. That is to say, if film formation is performed under the low temperature condition in which the BTCSM gas is not pyrolyzed, it is difficult to have the finally-formed film become a film having a high C concentration.

(b) When forming the first solid layer, by keeping the exhaust rate of the BTCSM gas from the interior of the process chamber 201 lower than the supply rate of the BTCSM gas into the process chamber 201 or by confining the BTCSM gas in the process chamber 201, it is possible to sufficiently secure the heating time required in pyrolyzing the BTCSM gas. Furthermore, it is possible to rapidly increase the internal pressure of the process chamber 201 to a relatively high pressure and to maintain the internal pressure of the process chamber 201 at the relatively high pressure. This makes it possible to enhance the reaction efficiency. It is therefore possible to appropriately promote the pyrolysis of the BTCSM gas supplied into the process chamber 20 and to promote the formation of the first solid layer. As a result, it becomes possible to increase the formation rate of the first solid layer, namely the deposition rate of the finally-formed SiCN film. According to the present embodiment, even when the SiCN film is formed in a relatively low temperature zone of, e.g., 400 to 500 degrees C., the pyrolysis of the BTCSM gas is easily generated. This makes it possible to perform the formation of the SiCN film at a practical deposition rate. In addition, it is possible to reduce the amount of the BTCSM gas which is discharged from the interior of the process chamber 201 without making contribution to the formation of the first solid layer. This makes it possible to increase the use efficiency of the BTCSM gas and to reduce the film forming cost.

When forming the first solid layer, if the confinement of the BTCSM gas within the process chamber 201 is not performed, namely if the interior of the process chamber 201 is continuously evacuated by not fully closing the APC valve 244 but keeping the APC valve 244 in an open state, it becomes possible to rapidly discharge a reaction byproduct, which may be generated within the process chamber 201, from the interior of the process chamber 201. That is to say, it becomes possible to form the first solid layer while keeping the interior of the process chamber 201 in a clean state. As a result, it becomes possible to improve the quality of the finally-formed film.

When forming the first solid layer, if the confinement of the BTCSM gas within the process chamber 201 is performed, namely if the exhaust system is blocked by fully closing the APC valve 244, it becomes possible to further promote the pyrolysis of the BTCSM gas. That is to say, it becomes possible to further effectively perform the formation of the first solid layer and to increase the deposition rate of the finally-formed film. Moreover, it is possible to further increase the use efficiency of the BTCSM gas and to further reduce the film forming cost.

(c) By performing the formation of the first solid layer under the condition in which the CVD reaction is generated, namely under the condition in which the gas phase reaction of the BTCSM gas is generated, it becomes possible to make the thickness of the first solid layer larger than the thickness of the saturated adsorption layer of BTCSM. As a result, it becomes possible to enhance the formation rate of the first solid layer, namely the deposition rate of the finally-formed SiCN film, and to increase the productivity of the film forming process.

(d) At Step 2, by supplying the reactant such as the plasma-excited $NH_3$ gas or the like, it is possible to efficiently extract or desorb the impurities such as Cl and the like from the first solid layer. Thus, the second solid layer can be made a layer which is smaller in the amount of impurities than the first solid layer. As a result, even when film formation is performed in a relatively low temperature zone of, e.g., 400 to 500 degrees C., it becomes possible to reduce the impurity concentration within the SiCN film. As a consequence, the SiCN film can be made a film which has a high HF resistance.

(e) By using the precursor such as the BTCSM gas or the like acting as a Si source and a C source, and the reactant such as the $NH_3$ gas or the like acting as an N source, namely by using two kinds of gases, it is possible to form a film containing three elements, Si, C and N. In other words, when forming a film, there is no need to independently supply three kinds of gases, namely a Si source, a C source and an N source. For that reason, as compared with a case where three kinds of gases are used, it is possible to reduce the number of gas supply steps by one step. This makes it possible to shorten the required time per one cycle and to improve the productivity of a film forming process. Moreover, as compared with a case where three kinds of gases are used, it is possible to reduce the number of gas supply lines by one line. This makes it possible to simplify the structure of the substrate processing apparatus and to reduce the manufacturing cost or the maintenance cost of the substrate processing apparatus.

(f) By non-simultaneously or alternately performing the supply steps of different gases, it is possible to allow the gases to appropriately contribute to a reaction under a condition in which a gas phase reaction or a surface reaction is properly generated. Consequently, it is possible to improve the step coverage of the SiCN film and the film thickness controllability. In addition, it is possible to avoid generation of an excessive gas phase reaction within the process chamber 201 and to suppress generation of particles.

(g) The aforementioned effects may also be achieved in a case where a gas other than the BTCSM gas, which has Si—C bonds, is used as the precursor, a case where a nitrogen-containing gas other than the $NH_3$ gas is used as the reactant, or a case where a gas other than the nitrogen-containing gas, e.g., a gas containing N and C, an oxygen-containing gas, a boron-containing gas or a carbon-containing gas, is used as the reactant.

(4) Modifications

The film forming sequence according to the present embodiment is not limited to the form illustrated in FIG. 4 and may be modified as in the modifications to be described below.

Modification 1

Figure 5:
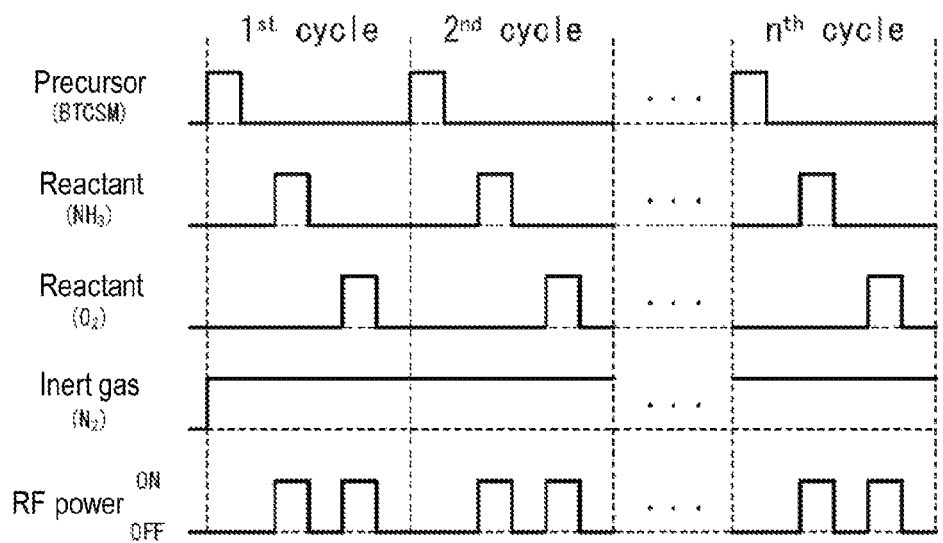
FIG. 5 is a view illustrating gas supply and plasma power supply timings in modification 1 of the film forming sequence according to one embodiment of the present disclosure.

As illustrated in FIG. 5, it may be possible to perform, a predetermined number of times, a cycle which non-simultaneously performs a step of supplying a BTCSM gas to a wafer 200, a step of supplying a plasma-excited $NH_3$ gas to the wafer 200, and a step of supplying a plasma-excited $O_2$ gas to the wafer 200. The $O_2$ gas may be supplied from the gas supply pipe 232b. The supply flow rate of the $O_2$ gas may be set to fall within a range of, e.g., 100 to 10,000 sccm. Other processing procedures and processing conditions may be similar to, e.g., the processing procedures and processing conditions of the film forming sequence described with reference to FIG. 4. According to this modification, a silicon oxycarbonitride film (or a SiOCN film) as a film containing Si, O, C and N can be formed on the wafer 200. In this modification, it is possible to achieve the effects similar to those of the aforementioned embodiment.

As the oxygen-containing gas, in addition to the $O_2$ gas, it may be possible to use, e.g., a nitrous oxide ($N_2O$) gas, a nitric monoxide (NO) gas, a nitrogen dioxide ($NO_2$) gas, an ozone ($O_3$) gas, a hydrogen ($H_2$)+$O_2$ gas, a $H_2$+$O_3$ gas, a water vapor ($H_2O$), a carbon monoxide (CO) gas, or a carbon dioxide ($CO_2$) gas.

Modification 2

Figure 6:
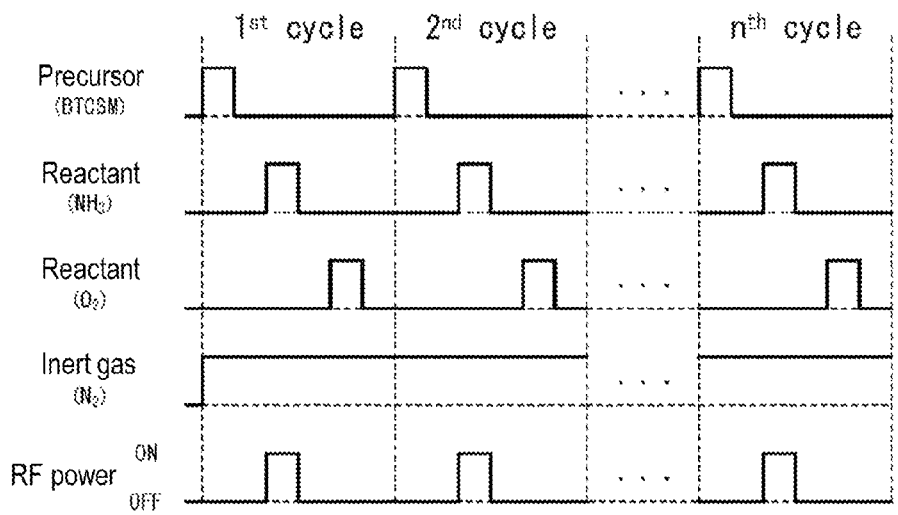
FIG. 6 is a view illustrating gas supply and plasma power supply timings in modification 2 of the film forming sequence according to one embodiment of the present disclosure.

As illustrated in FIG. 6, it may be possible to perform, a predetermined number of times, a cycle which non-simultaneously performs a step of supplying a BTCSM gas to a wafer 200, a step of supplying a plasma-excited $NH_3$ gas to the wafer 200, and a step of supplying a thermally-excited $O_2$ gas to the wafer 200. The $O_2$ gas may be supplied from the gas supply pipe 232c. Processing procedures and processing conditions may be similar to, e.g., the processing procedures and processing conditions of the film forming sequence described with reference to FIG. 4 or modification 1. According to this modification, a SiOCN film can be formed on the wafer 200. In this modification, it is possible to achieve the effects similar to those of the aforementioned embodiment. Furthermore, by supplying the thermally-excited $O_2$ gas, it is possible to suppress desorption of C from the second solid layer. As compared with modification 1 in which the plasma-excited $O_2$ gas is supplied, the finally-formed SiOCN film can be made a film which has a high C concentration.

Modification 3

Figure 7:
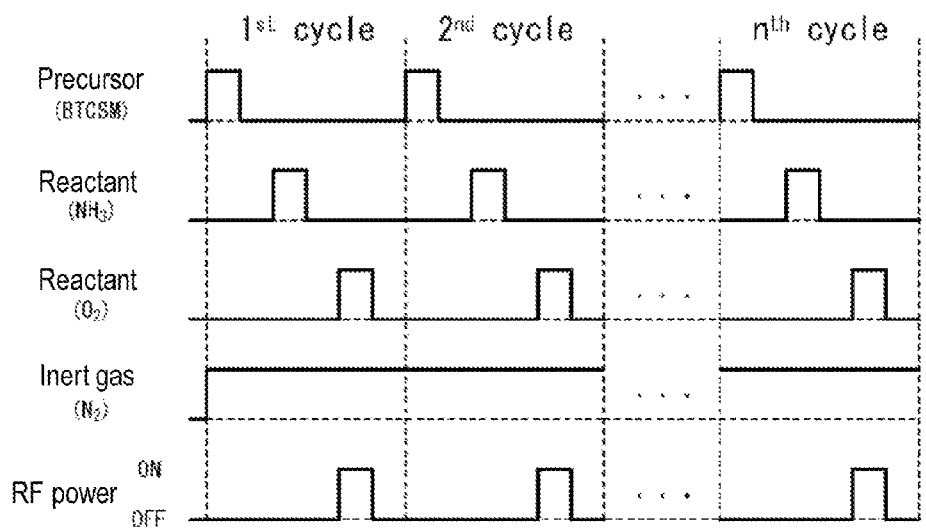
FIG. 7 is a view illustrating gas supply and plasma power supply timings in modification 3 of the film forming sequence according to one embodiment of the present disclosure.

As illustrated in FIG. 7, it may be possible to perform, a predetermined number of times, a cycle which non-simultaneously performs a step of supplying a BTCSM gas to a wafer 200, a step of supplying a thermally-excited $NH_3$ gas to the wafer 200, and a step of supplying a plasma-excited $O_2$ gas to the wafer 200. The $NH_3$ gas may be supplied from the gas supply pipe 232c. Processing procedures and processing conditions may be similar to, e.g., the processing procedures and processing conditions of the film forming sequence described with reference to FIG. 4 or modification 1. According to this modification, a SiOCN film can be formed on the wafer 200. In this modification, it is possible to achieve the effects similar to those of the aforementioned embodiment. Furthermore, by supplying the thermally-excited $NH_3$ gas, it is possible to suppress desorption of C from the first solid layer. As compared with modification 1 in which the plasma-excited $NH_3$ gas is supplied, the finally-formed SiOCN film can be made a film which has a high C concentration.

Modification 4

It may be possible to perform, a predetermined number of times, a cycle which non-simultaneously performs a step of supplying a BTCSM gas to a wafer 200, and a step of supplying a plasma-excited $O_2$ gas to the wafer 200. Processing procedures and processing conditions may be similar to, e.g., the processing procedures and processing conditions of the film forming sequence described with reference to FIG. 4 or modification 1. According to this modification, a silicon oxycarbide film (or a SiOC film) as a film containing Si, O and C can be formed on the wafer 200. In this modification, it is possible to achieve the effects similar to those of the aforementioned embodiment.

Modification 5

It may be possible to perform, a predetermined number of times, a cycle which non-simultaneously performs a step of supplying a BTCSM gas to a wafer 200, a step of supplying a plasma-excited $BCl_3$ gas to the wafer 200, and a step of supplying a plasma-excited $NH_3$ gas to the wafer 200. The $BCl_3$ gas may be supplied from the gas supply pipe 232b. The supply flow rate of the $BCl_3$ gas may be set to fall within a range of, e.g., 100 to 10,000 sccm. Other processing procedures and processing conditions may be similar to, e.g., the processing procedures and processing conditions of the film forming sequence described with reference to FIG. 4. According to this modification, a silicon borocarbonitride film (or a SiBCN film) as a film containing Si, B, C and N can be formed on the wafer 200. In this modification, it is possible to achieve the effects similar to those of the aforementioned embodiment. By adding B to the finally-formed film, it is possible to have the finally-formed film become a film having a high HF resistance.

As the boron-containing gas used as the reactant, in addition to the $BCl_3$ gas, it may be possible to use, e.g., a monochloroborane ($BClH_2$) gas, a dichloroborane ($BCl_2H$) gas, a trifluoroborane ($BF_3$) gas, a tribromoborane ($BBr_3$) gas, or a diborane ($B_2H_6$) gas.

Modification 6

It may be possible to perform, a predetermined number of times, a cycle which non-simultaneously performs a step of supplying a BTCSM gas to a wafer 200, a step of supplying a thermally-excited $BCl_3$ gas to the wafer 200, and a step of supplying a plasma-excited $NH_3$ gas to the wafer 200. The $BCl_3$ gas may be supplied from the gas supply pipe 232c. Processing procedures and processing conditions may be similar to, e.g., the processing procedures and processing conditions of the film forming sequence described with reference to FIG. 4 or modification 5. According to this modification, a SiBCN film can be formed on the wafer 200. In this modification, it is possible to achieve the effects similar to those of the aforementioned embodiment or modification 5. By supplying the thermally-excited $BCl_3$ gas, it is possible to suppress desorption of C from the first solid layer. As compared with modification 5 in which the plasma-excited $BCl_3$ gas is supplied, the finally-formed SiBCN film can be made a film which has a high C concentration.

Modification 7

It may be possible to perform, a predetermined number of times, a cycle which non-simultaneously performs a step of supplying a BTCSM gas to a wafer 200, a step of supplying a plasma-excited $BCl_3$ gas to the wafer 200, and a step of supplying a thermally-excited $NH_3$ gas to the wafer 200. The $NH_3$ gas may be supplied from the gas supply pipe 232c. Processing procedures and processing conditions may be similar to, e.g., the processing procedures and processing conditions of the film forming sequence described with reference to FIG. 4 or modification 5. According to this modification, a SiBCN film can be formed on the wafer 200. In this modification, it is possible to achieve the effects similar to those of the aforementioned embodiment or modifications 5 and 6. By supplying the thermally-excited $NH_3$ gas, it is possible to suppress desorption of C from the first solid layer modified by the supply of the $BCl_3$ gas, namely the solid layer containing Si, B and C. As compared with modification 5 in which the plasma-excited $NH_3$ gas is supplied, the finally-formed SiBCN film can be made a film which has a high C concentration.

Modification 8

It may be possible to perform, a predetermined number of times, a cycle which non-simultaneously performs a step of supplying a BTCSM gas to a wafer 200, and a step of supplying a plasma-excited TMB gas to the wafer 200. The TMB gas may be supplied from the gas supply pipe 232b. The supply flow rate of the TMB gas may be set to fall within a range of, e.g., 1 to 1,000 sccm. Other processing procedures and processing conditions may be similar to, e.g., the processing procedures and processing conditions of the film forming sequence described with reference to FIG. 4. According to this modification, a SiBCN film containing a borazine ring skeleton can be formed on the wafer 200. In this modification, it is possible to achieve the effects similar to those of the aforementioned embodiment. By adding the borazine ring skeleton to the SiBCN film, it is possible to have the SiBCN film become a film having a low dielectric constant and a high HF resistance.

Modification 9

It may be possible to perform, a predetermined number of times, a cycle which non-simultaneously performs a step of supplying a BTCSM gas to a wafer 200, a step of supplying a plasma-excited TMB gas to the wafer 200, and a step of supplying a plasma-excited $NH_3$ gas to the wafer 200. Processing procedures and processing conditions may be similar to, e.g., the processing procedures and processing conditions of the film forming sequence described with reference to FIG. 4 or modification 8. According to this modification, a SiBCN film containing a borazine ring skeleton can be formed on the wafer 200. In this modification, it is possible to achieve the effects similar to those of the aforementioned embodiment. By performing the step of supplying the plasma-excited $NH_3$ gas, it is possible to have the finally-formed SiBCN film become a film having an N concentration higher than that of modification 8.

Modification 10

It may be possible to perform, a predetermined number of times, a cycle which non-simultaneously performs a step of supplying a BTCSM gas to a wafer 200, a step of supplying a thermally-excited TMB gas to the wafer 200, and a step of supplying a plasma-excited $NH_3$ gas to the wafer 200. The TMB gas may be supplied from the gas supply pipe 232c. Processing procedures and processing conditions may be similar to, e.g., the processing procedures and processing conditions of the film forming sequence described with reference to FIG. 4 or modification 8. According to this modification, a SiBCN film containing a borazine ring skeleton can be formed on the wafer 200. In this modification, it is possible to achieve the effects similar to those of the aforementioned embodiment or modifications 8 and 9. By supplying the thermally-excited TMB gas, it is possible to suppress desorption of C from the first solid layer. Thus, as compared with modification 9 in which the plasma-excited TMB gas is supplied, it is possible to have the finally-formed SiBCN film become a film having a high C concentration.

Modification 11

It may be possible to perform, a predetermined number of times, a cycle which non-simultaneously performs a step of supplying a BTCSM gas to a wafer 200, a step of supplying a plasma-excited TMB gas to the wafer 200, and a step of supplying a thermally-excited $NH_3$ gas to the wafer 200. The $NH_3$ gas may be supplied from the gas supply pipe 232c. Processing procedures and processing conditions may be similar to, e.g., the processing procedures and processing conditions of the film forming sequence described with reference to FIG. 4 or modification 8. According to this modification, a SiBCN film containing a borazine ring skeleton can be formed on the wafer 200. In this modification, it is possible to achieve the effects similar to those of the aforementioned embodiment or modifications 8 to 10. By supplying the thermally-excited $NH_3$ gas, it is possible to suppress desorption of C from the first solid layer modified by the supply of the TMB gas, namely the solid layer having a borazine ring skeleton and containing Si, B, C and N. Thus, as compared with modification 9 in which the plasma-excited $NH_3$ gas is supplied, it is possible to have the finally-formed SiBCN film become a film having a high C concentration.

Modifications 12 to 16

By alternately performing the film forming processes according to the embodiment and the modifications described above, a laminated film composed of plural kinds of alternately-laminated films may be formed on a wafer 200.

Figure 8:
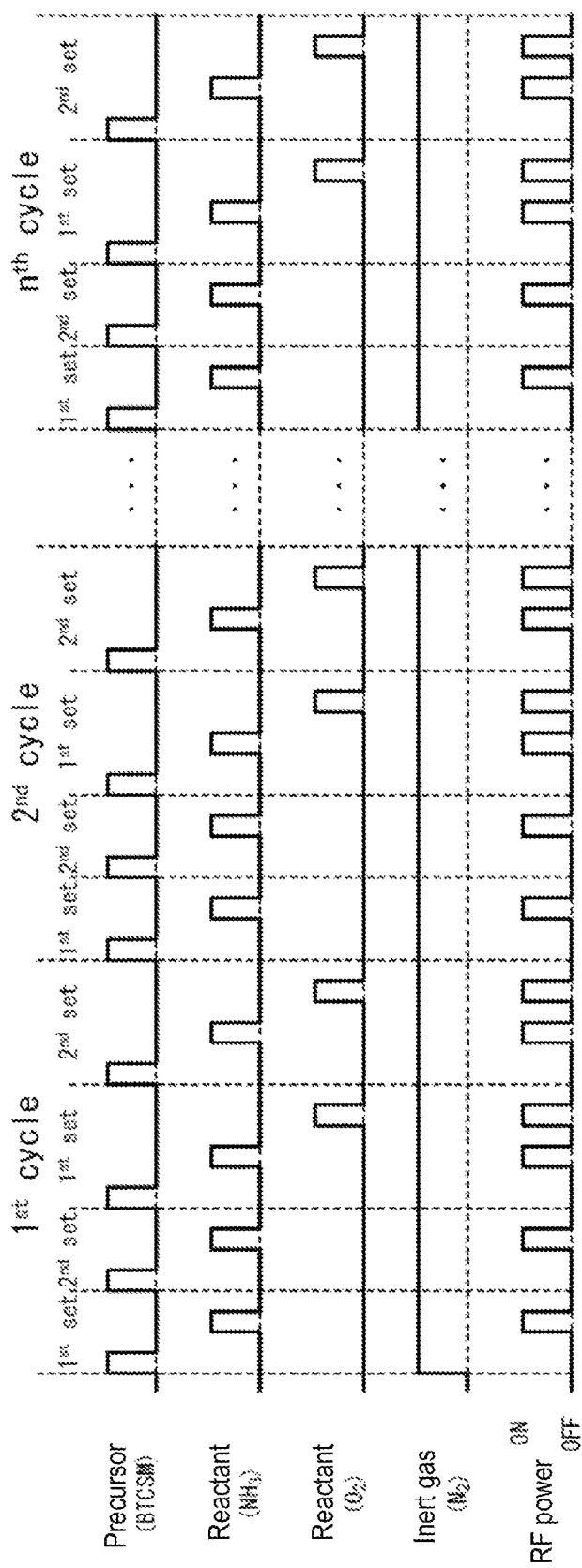
FIG. 8 is a view illustrating gas supply and plasma power supply timings in modification 12 of the film forming sequence according to one embodiment of the present disclosure.

For example, as illustrated in FIG. 8, a laminated film (or a SiOCN film) composed of a first film and a second film alternately laminated at a nano level may be formed on the wafer 200 by performing, a predetermined number of times (n times), a cycle which non-simultaneously performs:

a step of forming a SiCN film as the first film by performing, a predetermined number of times ($m_1$ times), a set which non-simultaneously performs a step of supplying a BTCSM gas to the wafer 200 and a step of supplying a plasma-excited $NH_3$ gas to the wafer 200; and a step of forming a SiOCN film as the second film by performing, a predetermined number of times ($m_2$ times), a set which non-simultaneously performs a step of supplying a BTCSM gas to the wafer 200, a step of supplying a plasma-excited $NH_3$ gas to the wafer 200 and a step of supplying a plasma-excited $O_2$ gas to the wafer 200 (Modification 12). FIG. 8 illustrates an example where the performing times (m1 times or m2 times) of each of the sets are two times.

Furthermore, a laminated film (or a SiOCN film) composed of a first film and a second film alternately laminated at a nano level may be formed on the wafer 200 by performing, a predetermined number of times (n times), a cycle which non-simultaneously performs:

a step of forming a SiOCN film as the first film by performing, a predetermined number of times ($m_1$ times), a set which non-simultaneously performs a step of supplying a BTCSM gas to the wafer 200, a step of supplying a plasma-excited $NH_3$ gas to the wafer 200 and a step of supplying a plasma-excited $O_2$ gas to the wafer 200; and a step of forming a SiOC film as the second film by performing, a predetermined number of times ($m_2$ times), a set which non-simultaneously performs a step of supplying a BTCSM gas to the wafer 200 and a step of supplying a plasma-excited $O_2$ gas to the wafer 200 (Modification 13).

Furthermore, a laminated film (or a SiOCN film) composed of a first film and a second film alternately laminated at a nano level may be formed on the wafer 200 by performing, a predetermined number of times (n times), a cycle which non-simultaneously performs:

a step of forming a SiCN film as the first film by performing, a predetermined number of times ($m_1$ times), a set which non-simultaneously performs a step of supplying a BTCSM gas to the wafer 200 and a step of supplying a plasma-excited $NH_3$ gas to the wafer 200; and a step of forming a SiOC film as the second film by performing, a predetermined number of times ($m_2$ times), a set which non-simultaneously performs a step of supplying a BTCSM gas to the wafer 200 and a step of supplying a plasma-excited $O_2$ gas to the wafer 200 (Modification 14).

Furthermore, a laminated film (or a SiBCN film) composed of a first film and a second film alternately laminated at a nano level may be formed on the wafer 200 by performing, a predetermined number of times (n times), a cycle which non-simultaneously performs:

a step of forming a SiCN film as the first film by performing, a predetermined number of times ($m_1$ times), a set which non-simultaneously performs a step of supplying a BTCSM gas to the wafer 200 and a step of supplying a plasma-excited $NH_3$ gas to the wafer 200; and a step of forming a SiBCN film as the second film by performing, a predetermined number of times ($m_2$ times), a set which non-simultaneously performs a step of supplying a BTCSM gas to the wafer 200, a step of supplying a plasma-excited $BCl_3$ gas to the wafer 200 and a step of supplying a plasma-excited $NH_3$ gas to the wafer 200 (Modification 15).

Furthermore, a laminated film (or a SiBCN film containing a borazine ring skeleton) composed of a first film and a second film alternately laminated at a nano level may be formed on the wafer 200 by performing, a predetermined number of times (n times), a cycle which non-simultaneously performs:

a step of forming a SiBCN film as the first film by performing, a predetermined number of times ($m_1$ times), a set which non-simultaneously performs a step of supplying a BTCSM gas to the wafer 200, a step of supplying a plasma-excited $BCl_3$ gas to the wafer 200 and a step of supplying a plasma-excited $NH_3$ gas to the wafer 200; and a step of forming a SiBCN film containing a borazine ring skeleton as the second film by performing, a predetermined number of times ($m_2$ times), a set which non-simultaneously performs a step of supplying a BTCSM gas to the wafer 200 and a step of supplying a plasma-excited TMB gas to the wafer 200 (Modification 16).

The processing procedures and processing conditions at the respective steps of modifications 12 to 16 may be similar to those of the film forming sequence illustrated in FIG. 4 or modifications 1 to 11. Furthermore, it is difficult to enable the thickness of each of the first film and the second film to become a thickness of less than 0.1 nm. Moreover, if the thickness of one of the first film and the second film exceeds 5 nm, there may be a case where the finally-formed laminated film becomes a film having non-uniform characteristics in a laminating direction. Accordingly, in modifications 12 to 16, the performing times (m1 times or m2 times) of each of the sets may be controlled such that the thickness of each of the first film and the second film becomes, e.g., 0.1 nm or more and 5 nm or less, specifically, 0.1 nm or more and 1 nm or less. By setting the thickness of each of the first film and the second film so as to fall within the aforementioned range, the finally-formed laminated film can be made a nano laminate film having integral and inseparable properties in the film as a whole.

In modifications 12 to 16, it is possible to achieve the effects similar to those of the film forming sequence illustrated in FIG. 4 or modifications 1 to 11. Furthermore, by alternately laminating the first film and the second film, it becomes possible to improve the controllability of the composition ratio of the finally-formed laminated film. Moreover, the finally-formed laminated film can be made a film having the properties of one or both of the first film and the second film, a film having the intermediate properties between the first film and the second film, or a film having the properties differing from the properties of the first film or the second film.

Modification 17

In the embodiment and the respective modifications described above, instead of the $NH_3$ gas, it may be possible to use a gas containing N and C, such as a TEA gas or the like. The supply flow rate of the TEA gas may be set to fall within a range of, e.g., 100 to 10,000 sccm. Other processing procedures and processing conditions may be similar to, e.g., the processing procedures and processing conditions of the film forming sequence described with reference to FIG. 4 or the respective modifications. In this modification, it is possible to achieve the effects similar to those of the embodiment or the respective modifications described above. Furthermore, by performing deposition using two kinds of carbon sources (double carbon sources) in one cycle, the finally-formed film can be made a film having a C concentration higher than that of the film formed in the film forming sequence illustrated in FIG. 4 or in the respective modifications described above. That is to say, it is possible to expand the window of control of the composition ratio.

As the N- and C-containing gas used as the reactant, in addition to the TEA gas, it may be possible to use, e.g., an ethylamine-based gas such as a diethylamine ($(C_2H_5)_2NH$, abbreviation: DEA) gas, a monoethylamine ($C_2H_5NH_2$, abbreviation: MEA) gas or the like, a methylamine-based gas such as a trimethylamine ($(CH_3)_3N$, abbreviation: TMA) gas, a dimethylamine ($(CH_3)_2NH$, abbreviation: DMA) gas, a monomethylamine ($CH_3NH_2$, abbreviation: MMA) gas or the like, a propylamine-based gas such as a tripropylamine ($(C_3H_7)_3N$, abbreviation: TPA) gas, a dipropylamine ($(C_3H_7)_2NH$, abbreviation: DPA) gas, a monopropylamine ($C_3H_7NH_2$, abbreviation: MPA) gas or the like, an isopropylamine-based gas such as a triisopropylamine ($[(CH_3)_2CH]_3N$, abbreviation: TIPA) gas, a diisopropylamine ($[(CH_3)_2CH]_2NH$, abbreviation: DIPA) gas, a monoisopropylamine ($(CH_3)_2CHNH_2$, abbreviation: MIPA) gas or the like, a butylamine-based gas such as a tributylamine ($(C_4H_9)_3N$, abbreviation: TBA) gas, a dibutylamine ($(C_4H_9)_2NH$, abbreviation: DBA) gas, a monobutylamine ($C_4H_9NH_2$, abbreviation: MBA) gas or the like, and an isobutylamine-based gas such as a triisobutylamine ($[(CH_3)_2CHCH_2]_3N$, abbreviation: TIBA) gas, a diisobutylamine ($[(CH_3)_2CHCH_2]_2NH$, abbreviation: DIBA) gas, a monoisobutylamine ($(CH_3)_2CHCH_2NH_2$, abbreviation: MIBA) gas or the like. That is to say, as the amine-based gas, it may be possible to use, for example, at least one of the gases expressed by composition formulae, $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ (where x is an integer of from 1 to 3). In order to increase the C concentration in the finally-formed film while suppressing an increase of the N concentration in the finally-formed film, a gas having a molecule in which the number of C atoms is larger than the number of N atoms is may be used as the amine-based gas. That is to say, as the amine-based gas, a gas which contains at least one amine selected from a group consisting of TEA, DEA, MEA, TMA, DMA, TPA, DPA, MPA, TIPA, DIPA, MIPA, TBA, DBA, MBA, TIBA, DIBA and MIBA may be used.

Modification 18

When supplying the reactant, instead of supplying the plasma-excited reactant, it may be possible to supply a plasma-excited inert gas and a reactant not excited with plasma.

For example, at Step 2 of the film forming sequence illustrated in FIG. 4, the $N_2$ gas may be plasma-excited by supplying the $NH_3$ gas from the gas supply pipe 232c, supplying the $N_2$ gas from the gas supply pipe 232f at this time, and supplying (applying) high-frequency power to between the rod-shaped electrodes 269 and 270. Processing procedures and processing conditions may be similar to, e.g., the processing procedures and processing conditions of the film forming sequence described with reference to FIG. 4. The $NH_3$ gas supplied from the gas supply pipe 232c into the process chamber 201 is indirectly excited by being post-mixed with the plasma-excited $N_2$ gas supplied from the buffer chamber 237 into the process chamber 201. By supplying the indirectly-excited $NH_3$ gas to the wafer 200, similar to the film forming sequence illustrated in FIG. 4, the modifying reaction of the first solid layer, namely the forming process of the second solid layer, goes ahead. Then, a SiCN film is formed on the wafer 200 by performing, a predetermined number of times, the cycle which non-simultaneously performs Steps 1 and 2.

In this modification, it is possible to achieve the effects similar to those of the aforementioned embodiment illustrated in FIG. 4. Furthermore, by supplying the $NH_3$ gas indirectly excited with the plasma-excited $N_2$ gas, it is possible to relatively softly generate the modifying reaction of the first solid layer using the $NH_3$ gas. Thus, it is possible to suppress breakage of the Si—C bonds contained in the first solid layer and to suppress desorption of C from the first solid layer. Consequently, the finally-formed SiCN film can be made a film having a C concentration higher than that of the SiCN film formed in the film forming sequence illustrated in FIG. 4. The aforementioned effects can be similarly achieved not only in the case of using the $NH_3$ gas as the indirectly-excited reactant but also in the case of using various kinds of gases other than the $NH_3$ gas (e.g., an $O_2$ gas, a $BCl_3$ gas, a TEA gas, a TMB gas and a $C_3H_6$ gas) as the indirectly-excited reactant. In these cases, it is possible to achieve the effects similar to those of the respective modifications described above.

Modification 19

Figure 9:
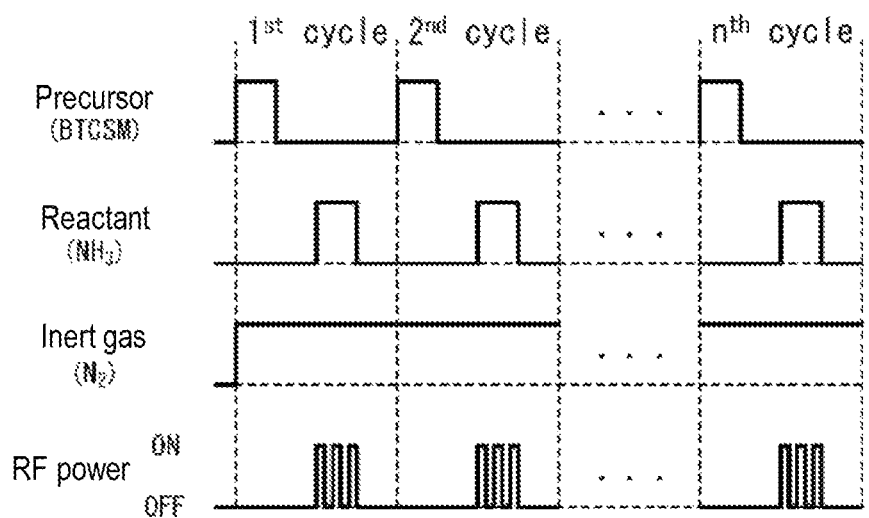
FIG. 9 is a view illustrating gas supply and plasma power supply timings in modification 18 of the film forming sequence according to one embodiment of the present disclosure.

As illustrated in FIG. 9, when supplying the plasma-excited reactant, it may be possible to intermittently excite the reactant with plasma. For example, at Step 2 of the film forming sequence illustrated in FIG. 4, the $NH_3$ gas may be plasma-excited by intermittently performing, a predetermined number of times, the supply of the high-frequency power to between the rod-shaped electrodes 269 and 270 rather than continuously performing the supply of the high-frequency power. FIG. 9 illustrates an example in which, at Step 2 of supplying the $NH_3$ gas, the supply of the high-frequency power to between the rod-shaped electrodes 269 and 270 is intermittently performed three times.

In this modification, it is possible to achieve the effects similar to those of the aforementioned embodiment illustrated in FIG. 4. Furthermore, by supplying the intermittently plasma-excited $NH_3$ gas, it is possible to relatively softly generate the modifying reaction of the first solid layer using the $NH_3$ gas. Thus, it is possible to suppress breakage of the Si—C bonds contained in the first solid layer and to suppress desorption of C from the first solid layer. Consequently, the finally-formed SiCN film can be made a film having a C concentration higher than that of the SiCN film formed in the film forming sequence illustrated in FIG. 4. The aforementioned effects can be similarly achieved not only in the case of using the $NH_3$ gas as the plasma-excited reactant but also in the case of using various kinds of gases other than the $NH_3$ gas (e.g., an $O_2$ gas, a $BCl_3$ gas, a TEA gas, a TMB gas and a $C_3H_6$ gas) as the plasma-excited reactant. In these cases, it is possible to achieve the effects similar to those of the respective modifications described above.

Modification 20

Modifications 18 and 19 may be combined with each other. That is to say, when supplying the plasma-excited inert gas and the reactant not excited with plasma, it may be possible to intermittently plasma-excite the inert gas. For example, at Step 2 of the film forming sequence illustrated in FIG. 4, the $NH_3$ gas may be indirectly and intermittently excited by supplying the $NH_3$ gas from the gas supply pipe 232c, supplying the $N_2$ gas from the gas supply pipe 232f at this time, and intermittently performing, a predetermined number of times, the supply of the high-frequency power to between the rod-shaped electrodes 269 and 270.

In this modification, it is possible to achieve the effects similar to those of the aforementioned embodiment illustrated in FIG. 4. Furthermore, by supplying the indirectly and intermittently excited $NH_3$ gas, it is possible to generate the modifying reaction of the first solid layer more softly than in modifications 18 and 19 using the $NH_3$ gas. Thus, it is possible to further suppress breakage of the Si—C bonds contained in the first solid layer and to further suppress desorption of C from the first solid layer. Consequently, the finally-formed SiCN film can be made a film having a C concentration even higher than that of the SiCN film formed in modifications 18 and 19. The aforementioned effects can be similarly achieved not only in the case of using the $NH_3$ gas as the indirectly and intermittently excited reactant but also in the case of using various kinds of gases other than the $NH_3$ gas (e.g., an $O_2$ gas, a $BCl_3$ gas, a TEA gas, a TMB gas and a $C_3H_6$ gas) as the plasma-excited reactant. In these cases, it is possible to achieve the effects similar to those of the respective modifications described above.

Modification 21

In the film forming sequence illustrated in FIG. 4 and the respective modifications described above, a $C_3H_6$ gas as a reactant may be supplied simultaneously with the precursor such as the BTCSM gas or the like, or the reactant such as a $NH_3$ gas, an $O_2$ gas, a TEA gas, a $BCl_3$ gas, a TMB gas or the like. That is to say, a step of supplying a $C_3H_6$ gas may be performed simultaneously with at least one of the step of supplying the precursor and the step of supplying the reactant other than the $C_3H_6$ gas.

Figure 10:
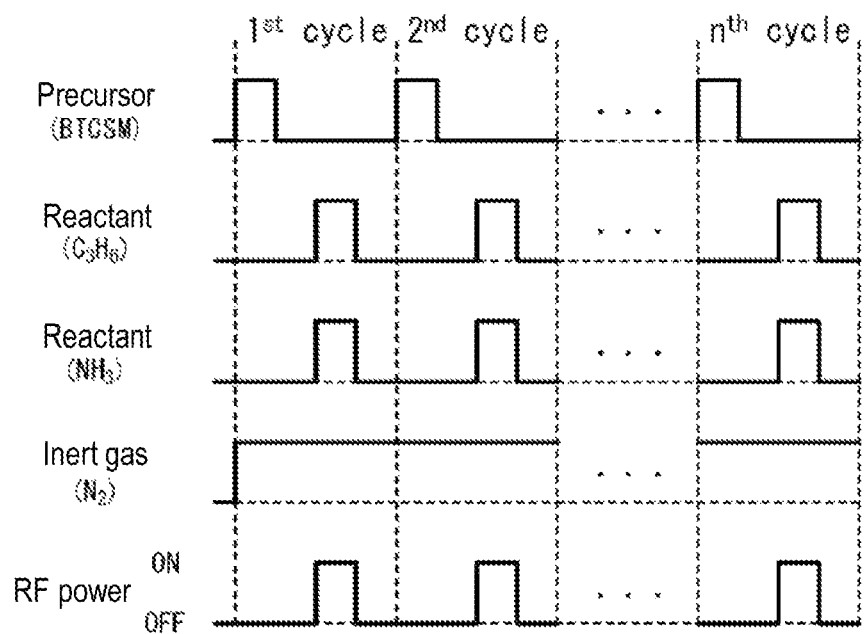
FIG. 10 is a view illustrating gas supply and plasma power supply timings in modification 21 of the film forming sequence according to one embodiment of the present disclosure.

FIG. 10 illustrates an example in which, in the film forming sequence illustrated in FIG. 4, the step of supplying the $C_3H_6$ gas is performed simultaneously with the step of supplying the $NH_3$ gas. The $C_3H_6$ gas may be supplied from the gas supply pipe 232d. The supply flow rate of the $C_3H_6$ gas may be set to fall within a range of, e.g., 100 to 10,000 sccm. Other processing procedures and processing conditions may be similar to, e.g., the processing procedures and processing conditions of the film forming sequence described with reference to FIG. 4.

According to this modification, it is possible to achieve the effects similar to those of the film forming sequence illustrated in FIG. 4 and the respective modifications described above. Furthermore, according to this modification, the C component contained in the $C_3H_6$ gas can be added to the finally-formed film. This makes it possible to further increase the C concentration within the finally-formed film. However, instead of supplying the $C_3H_6$ gas simultaneously with the BTCSM gas, the $C_3H_6$ gas may be supplied simultaneously with a $NH_3$ gas, an $O_2$ gas, a TEA gas, a $BCl_3$ gas or a TMB gas. In this case, it becomes possible to avoid an excessive gas phase reaction otherwise generated within the process chamber 201 and to suppress generation of particles within the process chamber 201. Moreover, instead of supplying the $C_3H_6$ gas simultaneously with a $NH_3$ gas, an $O_2$ gas or a $BCl_3$ gas, the $C_3H_6$ gas may be supplied simultaneously with a TMB gas or a TEA gas. In this case, it becomes possible to enhance the controllability of the composition ratio of the finally-formed film. In the case of supplying the $C_3H_6$ gas simultaneously with the TMB gas or the TEA gas, deposition is performed using three kinds of C sources (triple carbon sources) in one cycle. Thus, the finally-formed film can be made a film having a C concentration higher than that of the film formed in the film forming sequence illustrated in FIG. 4 or each of the modifications described above.

As the carbon-containing gas used as the reactant, in addition to the $C_3H_6$ gas, it may be possible to use, e.g., a hydrocarbon gas such as an acetylene ($C_2H_2$) gas, an ethylene ($C_2H_4$) gas or the like.

Other Embodiments of the Present Disclosure

While one embodiment of the present disclosure has been specifically described above, the present disclosure is not limited to the aforementioned embodiment but may be differently modified without departing from the spirit of the present disclosure.

For example, in the aforementioned embodiment, there has been described an example where the reactant is supplied after the supply of the precursor. The present disclosure is not limited thereto. The supply order of the precursor and the reactant may be reversed. That is to say, the precursor may be supplied after the supply of the reactant. By changing the supply order of the precursor and the reactant, it is possible to change the quality or the composition ratio of the thin film thus formed. In the case where plural kinds of reactants are used, the supply order of the reactants may be arbitrarily changed. By changing the supply order of the reactants, it is possible to change the quality or the composition ratio of the thin film thus formed.

If the silicon-based insulating film formed by the method of the embodiment or each of the modifications described above is used as a sidewall spacer, it is possible to provide a technique of forming a device which is small in leak current and superior in workability. If the aforementioned silicon-based insulating film is used as an etching stopper, it is possible to provide a technique of forming a device which is superior in workability. According to modifications 18 to 20 described above, it is possible to form a silicon-based insulating film having an ideal stoichiometric ratio while using relatively soft plasma. Since the silicon-based insulating film can be formed while using relatively soft plasma, it is possible to adapt the present disclosure to a process for forming, e.g., a SADP film of a DPT, in which plasma damage is about a concern.

In the aforementioned embodiment, there has been described an example where the silicon-based thin film (the SiCN film, the SiOCN film, the SiOC film or the SiBCN film) containing Si as a semiconductor element is formed as a film containing a predetermined element. The present disclosure is not limited to the aforementioned form but may be appropriately applied to, e.g., a case where a metal-based thin film containing a metal element such as titanium (Ti), zirconium (Zr), hafnium (Hf), tantalum (Ta), niobium (Nb), aluminum (Al), molybdenum (Mo), tungsten (W) or the like is formed.

That is to say, the present disclosure may be suitably applied to, e.g., a case where a metal-based thin film, namely a metal carbide-based film, such as a TiCN film, a TiOCN film, a TiOC film, a TiBCN film, a ZrCN film, a ZrOCN film, a ZrOC film, a ZrBCN film, a HfCN film, a HfOCN film, a HfOC film, a HfBCN film, a TaCN film, a TaOCN film, a TaOC film, a TaBCN film, a NbCN film, a NbOCN film, a NbOC film, a NbBCN film, an AlCN film, an AlOCN film, an AlOC film, an AlBCN film, a MoCN film, a MoOCN film, a MoOC film, a MoBCN film, a WCN film, a WOCN film, a WOC film, a WBCN film, or the like is formed. In this case, instead of the precursor gas containing Si used in the aforementioned embodiment, a precursor gas containing a metal element may be used as the precursor gas, whereby film formation can be performed by the sequence similar to that of the embodiment or the modifications described above.

In the case of forming a Ti-based thin film, a precursor gas containing Ti, C and a halogen element and having a Ti—C bond may be used as a precursor containing Ti. As the reactant, it may be possible to use the same gas as used in the aforementioned embodiment. The processing conditions used at this time may be similar to, e.g., the processing conditions of the aforementioned embodiment.

In the case of forming a Zr-based thin film, a precursor gas containing Zr, C and a halogen element and having a Zr—C bond may be used as a precursor containing Zr. As the reactant, it may be possible to use the same gas as used in the aforementioned embodiment. The processing conditions used at this time may be similar to, e.g., the processing conditions of the aforementioned embodiment.

In the case of forming an Hf-based thin film, a precursor gas containing Hf, C and a halogen element and having an Hf—C bond may be used as a precursor containing Hf. As the reactant, it may be possible to use the same gas as used in the aforementioned embodiment. The processing conditions used at this time may be similar to, e.g., the processing conditions of the aforementioned embodiment.

In the case of forming a Ta-based thin film, a precursor gas containing Ta, C and a halogen element and having a Ta—C bond may be used as a precursor containing Ta. As the reactant, it may be possible to use the same gas as used in the aforementioned embodiment. The processing conditions used at this time may be similar to, e.g., the processing conditions of the aforementioned embodiment.

In the case of forming an Nb-based thin film, a precursor gas containing Nb, C and a halogen element and having an Nb—C bond may be used as a precursor containing Nb. As the reactant, it may be possible to use the same gas as used in the aforementioned embodiment. The processing conditions used at this time may be similar to, e.g., the processing conditions of the aforementioned embodiment.

In the case of forming an Al-based thin film, a precursor gas containing Al, C and a halogen element and having an Al—C bond may be used as a precursor containing Al. As the reactant, it may be possible to use the same gas as used in the aforementioned embodiment. The processing conditions used at this time may be similar to, e.g., the processing conditions of the aforementioned embodiment.

In the case of forming a Mo-based thin film, a precursor gas containing Mo, C and a halogen element and having a Mo—C bond may be used as a precursor containing Mo. As the reactant, it may be possible to use the same gas as used in the aforementioned embodiment. The processing conditions used at this time may be similar to, e.g., the processing conditions of the aforementioned embodiment.

In the case of forming a W-based thin film, a precursor gas containing W, C and a halogen element and having a W—C bond may be used as a precursor containing W. As the reactant, it may be possible to use the same gas as used in the aforementioned embodiment. The processing conditions used at this time may be similar to, e.g., the processing conditions of the aforementioned embodiment.

That is to say, the present disclosure may be suitably applied to a case where a thin film containing a predetermined element such as a semiconductor element, a metal element or the like as a first element, containing a nonmetallic element such as N, O, B or the like as a second element (or a third element) and containing C is formed.

Process recipes (e.g., programs describing substrate processing procedures and substrate processing conditions) used in forming these various kinds of films may be prepared individually (in a plural number) according to the contents of substrate processing (e.g., the kind, composition ratio, quality, thickness, processing procedure and processing condition of the film to be formed). In addition, at the start of the substrate processing, an appropriate process recipe may be properly selected from the recipes according to the substrate processing contents. Specifically, the recipes individually prepared according to the substrate processing contents may be stored (or installed) in advance in the memory device 121c of the substrate processing apparatus via a telecommunication line or a recording medium (e.g., the external memory device 123) storing the recipes. Moreover, at the start of the substrate processing, the CPU 121a of the substrate processing apparatus may properly select an appropriate recipe from the recipes stored in the memory device 121c according to the substrate processing contents. This configuration enables a single substrate processing apparatus to form films of different kinds, composition ratios, qualities and thicknesses for general purposes and with enhanced reproducibility. In addition, this configuration makes it possible to reduce an operator's operation burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. In these cases, the processing procedures and the processing conditions may be similar to, e.g., the processing procedures and the processing conditions of the aforementioned embodiment.

Figure 13:
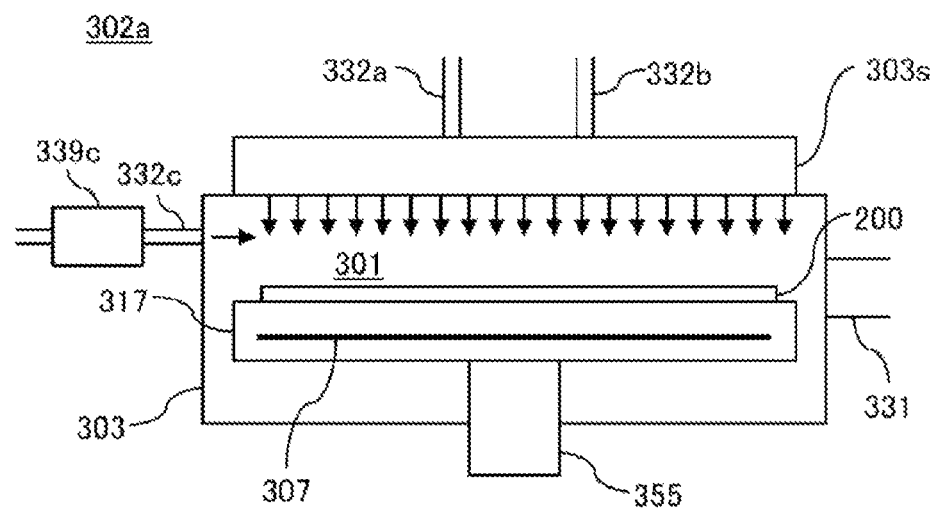
FIG. 13 is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302a illustrated in FIG. 13. The processing furnace 302a includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the aforementioned precursor and a gas supply port 332b configured to the supply the aforementioned reactant are connected to inlets (gas introduction holes) of the shower head 303s. A gas supply port 332c as a gas supply part configured to supply the plasma-excited reactant or the plasma-excited inert gas mentioned above is connected to the sidewall of the process vessel 303, namely the lateral side of the end portions of the wafers 200 carried into the process chamber 301. A precursor supply system similar to the precursor supply system of the aforementioned embodiment is connected to the gas supply port 332a. A reactant supply system similar to the reactant supply system of the aforementioned embodiment is connected to the gas supply port 332b. A remote plasma unit (or a plasma generating device) 339c as an exciting unit configured to supply the aforementioned reactant or inert gas by plasma-exciting the same, and a reactant supply system similar to the reactant supply system of the aforementioned embodiment, or an inert gas supply system similar to the inert gas supply system of the aforementioned embodiment, are connected to the gas supply port 332c. A gas distribution plate configured to supply a gas into the process chamber 301 in a shower-like manner is installed in outlets (gas discharge holes) of the shower head 303s. The shower head 303s is installed in such a position as to face the surfaces of the wafers 200 carried into the process chamber 301. The gas supply port 332c is formed in such a position as not to face the surfaces of the wafers 200 carried into the process chamber 301. An exhaust port 331 configured to evacuate the interior of the process chamber 301 is installed in the process vessel 303. An exhaust system similar to the exhaust system of the aforementioned embodiment is connected to the exhaust port 331.

Figure 14:
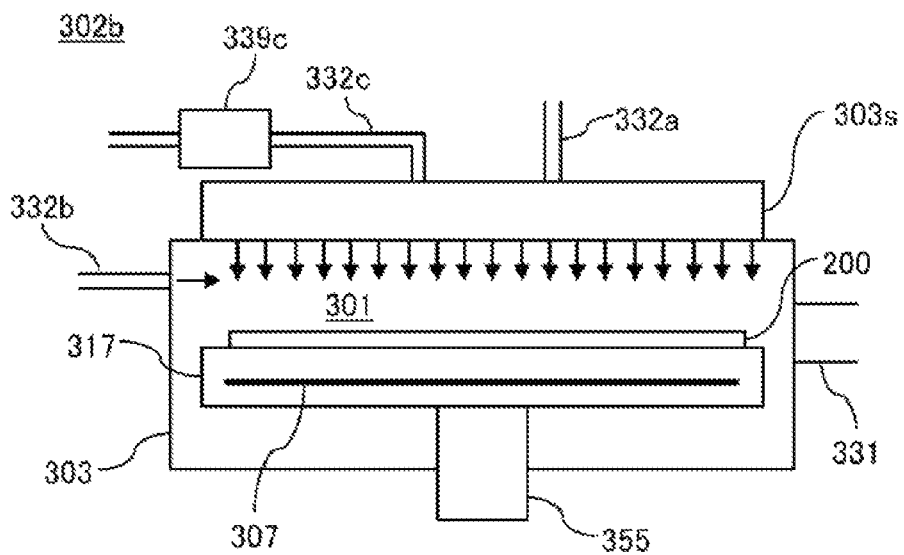
FIG. 14 is a schematic configuration view of a processing furnace of a substrate processing apparatus suitably used in a further embodiment of the present disclosure, in which a portion of the processing furnace is shown in a vertical cross section.

Furthermore, the present disclosure may be suitably applied to, e.g., a case where a film is formed using a substrate processing apparatus provided with a processing furnace 302b illustrated in FIG. 14. A gas supply port 332a configured to supply the aforementioned precursor and a gas supply port 332c configured to supply the plasma-excited reactant or the plasma-excited inert gas mentioned above are connected to inlets of a shower head 303s as a gas supply part. A gas supply port 332b as a gas supply part configured to supply the aforementioned reactant is connected to the sidewall of a process vessel 303, namely the lateral side of the end portions of the wafers 200 carried into a process chamber 301. A precursor supply system similar to the precursor supply system of the aforementioned embodiment is connected to the gas supply port 332a. A reactant supply system similar to the reactant supply system of the aforementioned embodiment is connected to the gas supply port 332b. A remote plasma unit 339c having the configuration mentioned above and a reactant supply system similar to the reactant supply system of the aforementioned embodiment, or an inert gas supply system similar to the inert gas supply system of the aforementioned embodiment, are connected to the gas supply port 332c. The shower head 303s is installed in such a position as to face the surfaces of the wafers 200 carried into the process chamber 301. The gas supply port 332b is formed in such a position as not to face the surfaces of the wafers 200 carried into the process chamber 301. Other components having the same configurations as those of the processing furnace 302a illustrated in FIG. 13 are designated by like reference symbols with the description thereof omitted.

Figure 15:
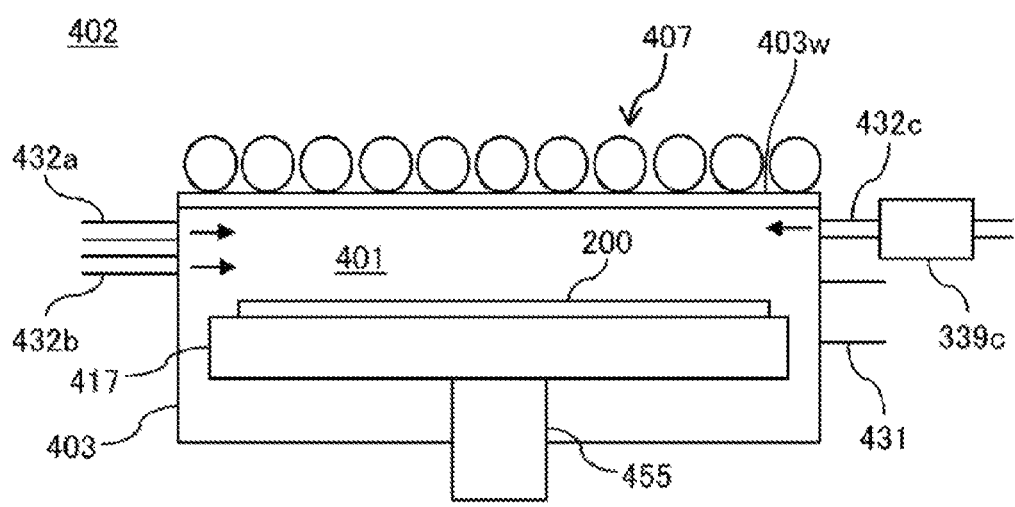
FIG. 15 is a schematic configuration view of a processing furnace of a substrate processing apparatus suitably used in a still further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 15. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a as a gas supply part configured to supply the aforementioned precursor, a gas supply port 432b as a gas supply part configured to supply the aforementioned reactant and a gas supply port 432c as a gas supply part configured to supply the plasma-excited reactant or the plasma-excited inert gas mentioned above are connected to the process vessel 403. A precursor supply system similar to the precursor supply system of the aforementioned embodiment is connected to the gas supply port 432a. A reactant supply system similar to the reactant supply system of the aforementioned embodiment is connected to the gas supply port 432b. A remote plasma unit 339c having the aforementioned configuration and a reactant supply system similar to the reactant supply system of the aforementioned embodiment, or an inert gas supply system similar to the inert gas supply system of the aforementioned embodiment, are connected to the gas supply port 432c. The gas supply ports 432a to 432c are respectively installed at the lateral side of the end portions of the wafers 200 carried into the process chamber 401, namely in such positions as not to face the surfaces of the wafers 200 carried into the process chamber 40. An exhaust port 431 configured to evacuate the interior of the process chamber 401 is installed in the process vessel 403. An exhaust system similar to the exhaust system of the aforementioned embodiment is connected to the exhaust port 431.

In the case of using these substrate processing apparatuses, film formation can be performed by the sequences and processing conditions similar to those of the embodiment and the modifications described above.

The embodiment and the modifications described above may be appropriately combined with one another. In addition, the processing conditions used in this case may be similar to, e.g., the processing conditions of the embodiment described above.

Aspects of the Present Disclosure

Hereinafter, some aspects of the present disclosure are additionally described as supplementary notes.
(Supplementary Note 1)
According to one aspect of the present disclosure, there are provided a method of manufacturing a semiconductor device and a substrate processing method, including forming a film containing a first element, a second element and carbon on a substrate by performing a cycle a predetermined number of times, the cycle including non-simultaneously performing:
forming a first solid layer having a thickness of more than one atomic layer and equal to or less than several atomic layers and containing chemical bonds of the first element and carbon by supplying a precursor having the chemical bonds of the first element and carbon to the substrate under a condition in which the precursor is pyrolyzed and at least some of the chemical bonds of the first element and carbon contained in the precursor are maintained without being broken; and
forming a second solid layer by plasma-exciting a reactant containing the second element and supplying the plasma-excited reactant to the substrate to modify the first solid layer, or by plasma-exciting an inert gas and supplying the plasma-excited inert gas and a reactant containing the second element which is not plasma-excited to the substrate to modify the first solid layer.
(Supplementary Note 2)
In the method of Supplementary Note 1, in the act of forming the first solid layer, at least some of the chemical bonds of the first element and carbon contained in the precursor may be introduced into the first solid layer while the at least some of the chemical bonds of the first element and carbon are maintained without being broken.
(Supplementary Note 3)
In the method of Supplementary Note 1 or 2, in the act of forming the first solid layer, the first solid layer may be formed such that a number of the chemical bonds of the first element and carbon contained in the first solid layer becomes greater than a number of chemical bonds of the first element and carbon contained in a chemisorption layer of the precursor, the chemisorption layer being formed by chemisorption of the precursor.
(Supplementary Note 4)
In the method of any one of Supplementary Notes 1 to 3, in the act of forming the first solid layer, the first solid layer may be formed such that a number of the chemical bonds of the first element and carbon contained in the first solid layer becomes greater than the number of chemical bonds of the first element and carbon contained in a chemisorption layer of the precursor, the chemisorption layer being formed by saturation of chemisorption of the precursor.
(Supplementary Note 5)
In the method of any one of Supplementary Notes 1 to 4, in the act of forming the first solid layer, the first solid layer may be formed such that a thickness of the first solid layer is greater than a thickness of a chemisorption layer of the precursor, the chemisorption layer being formed by saturation of chemisorption of the precursor.
(Supplementary Note 6)
In the method of any one of Supplementary Notes 1 to 5, the first solid layer may have a thickness of several atomic layers.
(Supplementary Note 7)
In the method of any one of Supplementary Notes 1 to 6, the first solid layer may be a deposition layer in which the first element and carbon are deposited.
(Supplementary Note 8)
In the method of any one of Supplementary Notes 1 to 7, the act of forming the first solid layer may be performed under a condition in which a gas phase reaction (CVD reaction) is generated.
(Supplementary Note 9)
In the method of any one of Supplementary Notes 1 to 8, in the act of forming the first solid layer, the precursor may be exhausted from an interior of a space where the substrate exists while supplying the precursor to the interior of the space under a condition in which an exhaust rate of the precursor from the interior of the space may be maintained smaller than a supply rate of the precursor to the interior of the space.
(Supplementary Note 10)
In the method of any one of Supplementary Notes 1 to 9, in the act of forming the second solid layer, the reactant may be supplied to the substrate under a condition in which at least some of the chemical bonds of the first element and carbon contained in the first solid layer are maintained without being broken.
(Supplementary Note 11)
In the method of any one of Supplementary Notes 1 to 10, in the act of forming the second solid layer, the first solid layer is modified while maintaining, without breaking, at least some of the chemical bonds of the first element and carbon contained in the first solid layer.
(Supplementary Note 12)
In the method of any one of Supplementary Notes 1 to 11, in the act of forming the second solid layer, the reactant may be intermittently plasma-excited when plasma-exciting the reactant.
(Supplementary Note 13)
In the method of any one of Supplementary Notes 1 to 12, in the act of forming the second solid layer, the inert gas may be intermittently plasma-excited when plasma-exciting the inert gas.
(Supplementary Note 14)
In the method of any one of Supplementary Notes 1 to 13, the cycle may further include performing supplying a reactant containing a third element to the substrate, wherein a film containing the first element, the second element, the third element, and carbon may be formed on the substrate by performing the cycle the predetermined number of times.

(Supplementary Note 15)

In the method of any one of Supplementary Notes 1 to 14, the cycle may further include performing, non-simultaneously with the act of forming the first solid layer and the act of forming the second solid layer, forming a third solid layer by supplying a reactant containing a third element to the substrate to modify the second solid layer, wherein a film containing the first element, the second element, the third element, and carbon may be formed on the substrate by performing the cycle the predetermined number of times.

(Supplementary Note 16)

In the method of any one of Supplementary Notes 1 to 15, the precursor may contain the first element, carbon, and a halogen element.

(Supplementary Note 17)

In the method of any one of Supplementary Notes 1 to 16, the precursor may have at least two chemical bonds of the first element and carbon in one molecule (in the chemical structural formula thereof).

(Supplementary Note 18)

In the method of any one of Supplementary Notes 1 to 17, the reactant may include at least one selected from a group consisting of a nitrogen-containing gas (a nitriding gas or a hydrogen nitride-based gas), a carbon-containing gas (a hydrocarbon-based gas), a nitrogen- and carbon-containing gas (an amine-based gas or an organic hydrazine-based gas), an oxygen-containing gas (an oxidizing gas), a boron-containing gas (a borane-based gas), and a boron-, nitrogen- and carbon-containing gas (a borazine-based gas).

(Supplementary Note 19)

According to another aspect of the present disclosure, there is provided a substrate processing apparatus, including:

a process chamber configured to accommodate a substrate;

a precursor supply system configured to supply a precursor having chemical bonds of a first element and carbon to the substrate in the process chamber;

a reactant supply system configured to supply a reactant containing a second element to the substrate in the process chamber;

an inert gas supply system configured to supply an inert gas to the substrate in the process chamber;

a heater configured to heat the substrate in the process chamber;

an excitation unit configured to plasma-excite a gas; and a control unit configured to control the precursor supply system, the reactant supply system, the inert gas supply system and the heater so as to perform a process of forming a film containing the first element, the second element, and carbon on the substrate by performing a cycle a predetermined number of times, the cycle including non-simultaneously performing:

forming a first solid layer having a thickness of more than one atomic layer and equal to or less than several atomic layers and containing chemical bonds of the first element and carbon by supplying the precursor having the chemical bonds of the first element and carbon to the substrate in the process chamber under a condition in which the precursor is pyrolyzed and at least some of the chemical bonds of the first element and carbon are maintained without being broken; and forming a second solid layer by plasma-exciting the reactant and supplying the plasma-excited reactant to the substrate in the process chamber to modify the first solid layer, or by plasma-exciting the inert gas and supplying the plasma-excited inert gas and the reactant which is not plasma-excited to the substrate in the process chamber to modify the first solid layer.

(Supplementary Note 20)

According to a further aspect of the present disclosure, there are provided a program and a non-transitory computer-readable recording medium storing the program, wherein the program is configured to cause a computer to perform a process of forming a film containing a first element, a second element and carbon on a substrate by performing a cycle a predetermined number of times, the cycle including non-simultaneously performing:

forming a first solid layer having a thickness of more than one atomic layer and equal to or less than several atomic layers and containing chemical bonds of the first element and carbon by supplying a precursor having the chemical bonds of the first element and carbon to the substrate under a condition in which the precursor is pyrolyzed and at least some of the chemical bonds of the first element and carbon contained in the precursor are maintained without being broken; and forming a second solid layer by plasma-exciting a reactant containing the second element and supplying the plasma-excited reactant to the substrate to modify the first solid layer, or by plasma-exciting an inert gas and supplying the plasma-excited inert gas and a reactant containing the second element which is not plasma-excited to the substrate to modify the first solid layer.

According to the present disclosure in some embodiments, it is possible to form a film having a high carbon concentration.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film containing a first element, a second element and carbon on a substrate by performing a cycle a predetermined number of times, the cycle including non-simultaneously performing:

forming a first solid layer having a thickness of more than one atomic layer and equal to or less than several atomic layers and containing chemical bonds of the first element and carbon by supplying a precursor having the chemical bonds of the first element and carbon to the substrate under a condition in which the precursor is pyrolyzed and at least some of the chemical bonds of the first element and carbon contained in the precursor are maintained without being broken; and forming a second solid layer containing the first element, carbon and the second element by plasma-exciting a first reactant containing the second element and supplying the plasma-excited first reactant to the substrate to modify the first solid layer, or by plasma-exciting an inert gas and supplying the plasma-excited inert gas and a second reactant containing the second element which is not plasma-excited to the substrate to modify the first solid layer, wherein in the act of forming the first solid layer, the condition includes setting a temperature of the substrate to fall within a range of 400 degrees C. to 800 degrees C., and wherein in the act of forming the second solid layer, the second element is introduced into the second solid layer by modifying the first solid layer with the first reactant or the second reactant.

2. The method of claim 1, wherein in the act of forming the first solid layer, at least some of the chemical bonds of the first element and carbon contained in the precursor are introduced into the first solid layer while the at least some of the chemical bonds of the first element and carbon are maintained without being broken.

3. The method of claim 1, wherein in the act of forming the first solid layer, the first solid layer is formed such that a number of the chemical bonds of the first element and carbon contained in the first solid layer becomes greater than a number of chemical bonds of the first element and carbon contained in a chemisorption layer of the precursor, the chemisorption layer being formed by chemisorption of the precursor.

4. The method of claim 1, wherein in the act of forming the first solid layer, the first solid layer is formed such that a number of the chemical bonds of the first element and carbon contained in the first solid layer becomes greater than a number of chemical bonds of the first element and carbon contained in a chemisorption layer of the precursor, the chemisorption layer being formed by saturation of chemisorption of the precursor.

5. The method of claim 1, wherein in the act of forming the first solid layer, the first solid layer is formed such that a thickness of the first solid layer is greater than a thickness of a chemisorption layer of the precursor, the chemisorption layer being formed by saturation of chemisorption of the precursor.

6. The method of claim 1, wherein the first solid layer has a thickness of several atomic layers.

7. The method of claim 1, wherein the first solid layer is a deposition layer in which the first element and carbon are deposited.

8. The method of claim 1, wherein the act of forming the first solid layer is performed under a condition in which a gas phase reaction is generated.

9. The method of claim 1, wherein in the act of forming the first solid layer, the precursor is exhausted from an interior of a space where the substrate exists while supplying the precursor to the interior of the space under a condition in which an exhaust rate of the precursor from the interior of the space is maintained smaller than a supply rate of the precursor to the interior of the space.

10. The method of claim 1, wherein in the act of forming the second solid layer, the first reactant or the second reactant is supplied to the substrate under a condition in which at least some of the chemical bonds of the first element and carbon contained in the first solid layer are maintained without being broken.

11. The method of claim 1, wherein in the act of forming the second solid layer, the first solid layer is modified while maintaining, without breaking, at least some of the chemical bonds of the first element and carbon contained in the first solid layer.

12. The method of claim 1, wherein in the act of forming the second solid layer, the first reactant is intermittently plasma-excited when plasma-exciting the reactant.

13. The method of claim 1, wherein in the act of forming the second solid layer, the inert gas is intermittently plasma-excited when plasma-exciting the inert gas.

14. The method of claim 1, wherein the cycle further includes performing supplying a third reactant containing a third element to the substrate, wherein a film containing the first element, the second element, the third element, and carbon is formed on the substrate by performing the cycle the predetermined number of times.

15. The method of claim 1, wherein the cycle further includes performing, non-simultaneously with the act of forming the first solid layer and the act of forming the second solid layer, forming a third solid layer by supplying a third reactant containing a third element to the substrate to modify the second solid layer, wherein a film containing the first element, the second element, the third element, and carbon is formed on the substrate by performing the cycle the predetermined number of times.

16. The method of claim 1, wherein the precursor contains the first element, carbon, and a halogen element.

17. The method of claim 1, wherein the precursor has at least two chemical bonds of the first element and carbon in one molecule.

18. The method of claim 1, wherein the first reactant or the second reactant includes at least one selected from a group consisting of a nitrogen-containing gas, a carbon-containing gas, a nitrogen- and carbon-containing gas, an oxygen-containing gas, a boron-containing gas, and a boron-, nitrogen- and carbon-containing gas.

* * * * *